United States Patent [19]

Taylor et al.

[11] Patent Number: 4,859,933
[45] Date of Patent: Aug. 22, 1989

[54] NARROWBAND SIGNAL RECOGNITION FOR EMI MEASUREMENT

[75] Inventors: John B. Taylor, Santa Rosa; Michael K. Ellis, Rohnert Park, both of Calif.

[73] Assignee: Hewlett-Packard Company, Palo Alto, Calif.

[21] Appl. No.: 211,517

[22] Filed: Jun. 24, 1988

[51] Int. Cl.⁴ .............................................. G01R 23/00
[52] U.S. Cl. .................................. 324/77 B; 455/115
[58] Field of Search ............... 324/77 B, 77 D, 78 E, 324/78 Z, 79 R; 455/115; 364/485, 488, 481; 379/6, 31, 34

[56] References Cited

U.S. PATENT DOCUMENTS 4,317,223  2/1982  Farmer, Jr. ................... 455/115
4,390,838  6/1983  Savage ........................ 324/77 E

FOREIGN PATENT DOCUMENTS 680799  2/1964  Canada ........................ 455/115

OTHER PUBLICATIONS

"Transmitter Radiation Measuring Methods" by N. Lund, Proc. of the Inst. of Radio Eng., vol. 39, Jun. 1951, pp. 653-656.
"The FCC Controls" by E. W. Allen et al., Electronic Industries, Oct. 1960, pp. 86-92.

Primary Examiner—Stewart J. Levy
Assistant Examiner—Louis M. Arana
Attorney, Agent, or Firm—William C. Milks, III

[57] ABSTRACT

A test method and apparatus to aid a site operator in discriminating between signals measured at different times, as well as enabling a level of automation which is appropriate using state-of-the-art instrumentation for performing EMI measurements, such as open-site EMI measurements. Preferably, discrimination between the two signals is based on the two signals being separated by at least a frequency E defined as:

$$E = 2(\text{frequency span}/N) + K * RBW$$

where:
E = possible frequency error of a signal; frequency span = frequency range swept by a measuring receiver, for example, a spectrum analyzer;
N = number of points measured;
RBW = resolution bandwidth of a resolving bandpass filter of the measuring receiver; and
K = constant less than or equal to one to account for unknown signal characteristics.

With the specific application to open-site EMI measurements, preferably signals are allowed to be falsely detected as separate signals in order to take into account unknown signal characteristics, i.e., 1 RBW→K * RBW.

9 Claims, 20 Drawing Sheets $\triangle$ DISPLAY INCREMENT = ABS(1-3)
= 2

SIGNAL 2

SIGNAL 1

FIG 2

85870A MEASUREMENT BANDS: (SETUP NOT STORED)                    19:08:55

| bnd | trn | frequencies | | description | bnd | trn | frequencies | | description |
| --- | --- | --- | --- | --- | --- | --- | --- | --- | --- |
| 1 | 1 | 30.0 | 40.0 | Fxmo, Lnmo | 16 | 1 | 148.0 | 156.25 | Fx,Mo,Sat |
| 2 | 1 | 40.0 | 50.0 | Fxmo, Lnmo | 17 | 1 | 156.25 | 174.0 | Ln mo,Mar,Fx |
| 3 | 1 | 50.0 | 54.0 | 6m Ham | 18 | 1 | 174.0 | 200.0 | VHF TV #3 |
| 4 | 1 | 54.0 | 72.0 | VHF TV#1 | 19 | 2 | 200.0 | 216.0 | VHF TV #4 |
| 5 | 1 | 72.0 | 76.0 | Fx,Ast,Anv | 20 | 2 | 216.0 | 240.0 | Fx,Mo,Nav |
| 6 | 1 | 76.0 | 88.0 | VHF TV#2 | 21 | 2 | 240.0 | 328.6 | Fx,Mo,Sat |
| 7 | 1 | 88.0 | 93.0 | FM Radio #1 | 22 | 2 | 328.6 | 399.9 | Ar nav,Sat |
| 8 | 1 | 93.0 | 98.0 | FM Radio #2 | 23 | 2 | 399.9 | 450.0 | MISC |
| 9 | 1 | 98.0 | 103.0 | FM Radio #3 | 24 | 2 | 450.0 | 460.0 | Ln mo |
| 10 | 1 | 103.0 | 108.0 | FM Radio #4 | 25 | 2 | 460.0 | 470.0 | Ln mo,Met |
| 11 | 1 | 108.0 | 117.975 | Ar Nav | 26 | 2 | 470.0 | 584.0 | UHF TV 14-32 |
| 12 | 1 | 117.975 | 132.0 | Ar Mob | 27 | 2 | 584.0 | 692.0 | UHF TV 33-50 |
| 13 | 1 | 132.0 | 136.0 | Ar Mob | 28 | 2 | 692.0 | 806.0 | UHF TV 51-69 |
| 14 | 1 | 136.0 | 144.0 | Fx,Mo,Sp | 29 | 2 | 806.0 | 902.0 | Ln mo |
| 15 | 1 | 144.0 | 148.0 | 2m Ham | 30 | 2 | 902.0 | 1000.0 | Ln mo,Fx,Ar |

FIG 3

| Automatic Identification Selections | Selected Commands 19:16:13 |
|---|---|
| SELECT BAND(S) TO MEASURE | PAUSE: ATTACH BICONICAL ANTENNA |
| SET ANTENNA HEIGHT | TURNTABLE ANGLE: 52 (deg) |
| SET ANTENNA POLARIZATION | BANDS: 1,3,4,5,6,7,8,9,10,11,12,13,14 |
| SET ANTENNA TO PRESET HEIGHT | BANDS: 15,16,17,18 |
| SET TABLE ANGLE | TURN EUT OFF |
| TURN EUT ON/OFF | ANTENNA HEIGHT: 325 cm |
| START AUTOMATIC MEASUREMENT | START AUTOMATIC MEASUREMENT |
| ENTER TIME TO START MEASUREMENT | TURN EUT ON |
| PAUSE FOR MANUAL INTERACTION | SET ANTENNA TO PRESET HEIGHT |
| PRINT AMBIENT LIST | START AUTOMATIC MEASUREMENT |
| PRINT SUSPECT LIST | SAVE DATA IN TEMPORARY BOAT FILE |
| PRINT AMBIENT GRAPHICS | |
| PRINT SUSPECT GRAPHICS | |
| SAVE DATA IN TEMPORARY BOAT FILE | |
| CALL USER-WRITTEN SUBROUTINE | |

| RETURN | ADD ENTRY | INSERT ENTRY | DELETE ENTRY | | SCRATCH ALL | | CMD_FILE LIBRARY |

FIG 4

```
Characterize Signal Selections          Selected Commands      21:26:09
SPECIFY SIGNAL(S)                       EUT ON
EUT ON/OFF                              SIGNAL(S) 1
SEARCH ANTENNA                             SEARCH TURNTABLE FROM 1 TO 359 deg
SEARCH TURNTABLE                           SEARCH ANTENNA FROM 100 TO 360 cm.
CHANGE ANTENNA HEIGHT                      ANT/TABLE REFERENCE: CURRENT POS
SET ANTENNA POLARIZATION                ALL SIGNALS
SET ANTENNA TO PRESET HEIGHT               FINE FREQUENCY ADJUSTMENT
CHANGE TURNTABLE ANGLE                     SEARCH TURNTABLE +/- 45 deg.
DEFINE ANT/TABLE REFERENCE POSITION        SEARCH ANTENNA +/- 100 cm.
MOVE ANT/TABLE TO REFERENCE POSITION       MEASURE 5 sec/ UPDATE DATA
PAUSE FOR MANUAL INTERACTION               OBSERVE 5 sec/ MEASURE QUASI-PEAK
WORST CASE POSITIONS
MEASURE/UPDATE DATA
QUASI-PEAK MEASUREMENT
PAUSE/REVIEW BEFORE UPDATING DATA
CALL USER-WRITTEN SUBROUTINE
DUMP DISPLAY TO PRINTER
CLEAR GRAPHS
FINE FREQUENCY ADJUSTMENT
```

POLARIZATION: V
ANTENNA: 140 cm
TABLE: 75 deg
EUT: ON

| RETURN | ADD ENTRY | INSERT ENTRY | DELETE ENTRY | | SCRATCH ALL | | SIG_CMD LIBRARY |

REVIEWING ALL FINALS

| No | T | FREQ MHz | PEAK LIM | PEAK ABS | QP LIM | QP ABS | ANT P cm | AZ deg | COMMENTS |
|---|---|---|---|---|---|---|---|---|---|
| 1 | ⊥ | 36.759 | −3 | 37 | −4 | 36 | V139 | 68 | |
| 2 | ⊥ | 44.16 | 6 | 46 | 6 | 45 | V139 | 68 | |
| 3 | ⊥ | 49.062 | 2 | 42 | 1 | 41 | V142 | 75 | See Note 1 |
| 4 | ⊥ | 55.21 | −6 | 33 | −8 | 32 | V140 | 75 | |

NOTES:
Note 1: This signal masked by ambient

POLARIZATION: V
ANTENNA: 140 cm
TABLE: 75 deg
EUT: ON

| RETURN | RE-MEASURE | QUASI PEAK | SIG PEAK | AUTO CHAR. | EUT OFF | UPD COM/NOTE | MORE KEYS |
| RETURN | →SUSPCT LIST | →AMB LIST | ZOOM LOCAL | LIMIT LINE OFF | INST STATES | RESET POS | MORE KEYS |

FIG 8

EMI COMPONENTS CURRENTLY CONNECTED TO SYSTEM:

701  PRINTER
717  QUASI-PEAK ADAPTER
718  SPECTRUM ANALYZER
719  PRESELECTOR

EMI COMPONENTS CURRENTLY NOT CONNECTED TO SYSTEM:

705  PLOTTER
708  TOWER
707  TABLE
728  ATTENUATOR DRIVER

LIBRARY MSI:

FIG 11

| Automatic Identification Selections | Selected Commands | 13:07:55 |
|---|---|---|
| SELECT BAND(S) TO MEASURE<br>SET ANTENNA HEIGHT<br>SET ANTENNA POLARIZATION<br>SET ANTENNA TO PRESET HEIGHT<br>SET TABLE ANGLE<br>TURN EUT ON/OFF<br>START AUTOMATIC MEASUREMENT<br>ENTER TIME TO START MEASUREMENT<br>PAUSE FOR MANUAL INTERACTION<br>PRINT AMBIENT LIST<br>PRINT SUSPECT LIST<br>PRINT AMBIENT GRAPHICS<br>PRINT SUSPECT GRAPHICS<br>SAVE DATA IN TEMPORARY BOAT FILE<br>CALL USER-WRITTEN SUBROUTINE | BANDS: 1,2,3,4,5,6,7,8,9,10,11,12,13<br>BANDS: 14,15,16<br>POLARIZATION: HORIZONTAL<br>TURN EUT OFF<br>SET ANTENNA TO PRESET HEIGHT<br>START AUTOMATIC MEASUREMENT<br>TURN EUT ON<br>SET ANTENNA TO PRESET HEIGHT<br>START AUTOMATIC MEASUREMENT<br>POLARIZATION: VERTICAL<br>TURN EUT OFF<br>SET ANTENNA TO PRESET HEIGHT<br>START AUTOMATIC MEASUREMENT<br>TURN EUT ON<br>SET ANTENNA TO PRESET HEIGHT<br>START AUTOMATIC MEASUREMENT | |

POLARIZATION: H
ANTENNA: 101 cm
TABLE: 180 deg
EUT: OFF

REVIEWING ALL SUSPECTS

| No | FREQ MHz | BND | PEAK LIM | PEAK ABS | ANT P cm | AZ deg | COMMENTS |
|---|---|---|---|---|---|---|---|
| 1 | 30.09 | 1 | 6 | 46 | H101 | 180 | |
| 2 | 30.54 | 1 | 7 | 47 | H101 | 180 | |
| 3 | 31.91 | 1 | 9 | 49 | H101 | 180 | |
| 4 | 36.8 | 1 | 9 | 49 | H101 | 180 | |
| 5 | 39.8 | 1 | -2 | 38 | H101 | 180 | |
| 6 | 40.01 | 2 | 1 | 41 | H101 | 180 | |
| 7 | 44.26 | 2 | 16 | 56 | H101 | 180 | |
| 8 | 50. | 3 | -1 | 39 | H101 | 180 | |
| 9 | 68.03 | 4 | 6 | 46 | H101 | 180 | |
| 10 | 72.01 | 5 | 3 | 43 | H101 | 180 | |
| 11 | 76.01 | 6 | -4 | 36 | H101 | 180 | |
| 12 | 80.94 | 6 | -5 | 35 | H101 | 180 | |
| 13 | 87.08 | 6 | -3 | 37 | H101 | 180 | |
| 14 | 110.99 | 8 | -7 | 37 | H101 | 180 | |
| 15 | 125.72 | 9 | -10 | 34 | H101 | 180 | |
| 16 | 144.021 | 12 | -6 | 38 | H101 | 180 | |
| 17 | 156.314 | 14 | -14 | 30 | H101 | 180 | |
| 18 | 176.12 | 16 | -8 | 36 | H101 | 180 | |
| 19 | 216.93 | 17 | -21 | 25 | H101 | 180 | |

FIG 19

| Characterize Signal Commands | Selected Commands | 10:08:57 |
|---|---|---|
| | ALL SIGNALS | |
| SPECIFY SIGNAL(S) | ANT/TABLE REFERENCE: FINAL LIST POS | |
| EUT ON/OFF | MOVE ANT/TABLE TO REFERENCE POSITION | |
| SEARCH ANTENNA | SEARCH TURNTABLE +/-20 deg. | |
| SEARCH TURNTABLE | SEARCH ANTENNA +/- 50 cm. | |
| CHANGE ANTENNA HEIGHT | MEASURE 5 sec /UPDATE DATA | |
| SET ANTENNA TO PRESET HEIGHT | | |
| SET ANTENNA POLARIZATION | | |
| CHANGE TURNTABLE ANGLE | | |
| DEFINE ANT/TABLE REFERENCE POSITION | | |
| MOVE ANT/TABLE TO REFERENCE POSITION | | |
| PAUSE FOR MANUAL INTERACTION | | |
| WORST CASE POSITIONS | | |
| MEASURE/ UPDATE DATA | | |
| QUASI-PEAK MEASUREMENT | | |
| PAUSE/ REVIEW BEFORE UPDATING DATA | | |
| CALL USER-WRITTEN SUBROUTINE | | |
| DUMP DISPLAY TO PRINTER | | |
| CLEAR GRAPHS | | |

FIG 20

NARROWBAND SIGNAL RECOGNITION FOR EMI MEASUREMENT

BACKGROUND OF THE INVENTION

This invention relates to electromagnetic signal measuring instrumentation and, more particularly, to EMI measuring devices. Specifically, the invention is directed to a method and apparatus for narrowband signal recognition for EMI measurement using automated EMI measurement instruments, for example, automated open-site EMI measurement instruments.

Test procedures for open-site, radiated emission measurements are often time-consuming and tedious, requiring constant attention to detail. The extant demand for fast product testing turnover has created a clear need to increase productivity of radiated emission testing.

Open-site radiated emission measurements follow the guidelines promulgated by an international committee established for this purpose. The acronym for this committee is CISPR. The measurement studies and recommendations of CISPR are used worldwide as the basis on which to regulate emissions from commercial electronic and electric products Although limits of radiated field strength adopted by different countries may vary, the CISPR measurement guidelines are becoming the general standard.

CISPR guidelines specify that compliance measurements be made outdoors in a natural radio frequency (RF) environment. The transducers used in these measurements are generally broadband, calibrated antennas. Such antennas are varied in height and polarity so that the maximum of any radiating field from equipment under test (EUT) can be found. CISPR recommends distances between antenna and EUT and also requires the EUT to be rotated to find the maximum(s). Additionally, the bandwidths and the type of detection used by the measuring receiver are specified.

To define a test procedure that can be automated, the many complexities of the measurement environment must first be understood. Fortunately, open-site compliance measurements begin at 30 megahertz (MHz), whereas below 30 MHz, there is an abundance of radio signals, many large signals, and many more intermittent transmissions. Above 30 MHz, signals become more localized and predictable, but there can still be a large number and variety of transmissions, as shown in FIG. 1. Many of these signals, such as TV and FM radio transmissions, are the most powerful signals. EMI measurements near these strong fields are challenging. The possibility exists of over-driving the input circuitry of the measuring receiver, resulting in overload and erroneous readings. This problem is compounded when EMI measurements are attempted where there are many strong signals close together, such as in the FM radio band. The effective noise floor of the receiver is raised by the close spacing of the transmissions. This decreases the dynamic range between the limit and the noise floor, such that it becomes difficult to identify emissions. To regain some measurability, the resolution bandwidth of the measuring receiver may have to be lowered to resolve signals adjacent to and between large signals.

Also, unpredictable ambient emissions, such as intermittent transmissions produced by keyed transmission sources, can be mistaken for EUT emissions. Another complicating factor in some locations is the presence of broadband, incoherent noise or coherent, impulsive noise. These signals are produced by nearby vehicle ignition systems, industrial switching circuits, or even power lines swaying in the wind. As a result of all these emission sources, every site on which EMI measurements are made is different and has its own set of complexities that the site operator must deal with in developing a test plan. A site operator must become familiar with the ambient environment and make decisions during the tests based on this familiarity.

There are also complexities to EUT emissions. Usually EUT emissions from various products tested are directional and exhibit large variations in amplitude as the EUT is rotated. A first order approximation of the EUT azimuth variability and pre-positioning is desirable before any identification process begins.

Sometimes emissions are related to the operational state of the EUT. Having control of the EUT to establish these states requires knowledge of operation of the EUT. Also, a number of emission types can be radiated by the EUT. For example, EUT clocks produce narrowband emissions at specific frequencies and harmonics. Clock designs using ceramic resonators instead of crystal control can exhibit frequency jitter or instability. Products containing switching power supplies or generating fast rise-time pulses often produce broadband emissions. In other words, before open-site measurements begin, it is advantageous to learn something about the EUT by scanning with the antenna moved in close, or pre-scanning in a shielded room.

A test procedure based on complete turn-key automation, in which site operator discretion is eliminated, is not possible due to the complexities mentioned above. However, the complexity of CISPR radiated emission testing can be reduced and made less tedious and time-consuming.

One problem of known EMI measurement systems has been difficulty in discriminating between narrowband signals. Typically, this problem arises when measurements are performed to determine both the presence of ambient signals and the emission characteristics of the EUT.

Specifically, as a spectrum analyzer is swept across a frequency range to measure signals, signals appear at various spectral locations. However, due to complexities of both the measurement environment and EUT emissions, the frequency of a signal transmission can vary. Also, the measuring receiver can produce measurement errors. These are problems which either cannot be overcome (e.g., signal transmission uncertainties) or must be otherwise solved (i.e., improving the accuracy and precision of the measuring receiver).

However, digital uncertainties arising from the frequency span and the number of measurements performed during a sweep and the width of the resolving bandpass filter of the measuring receiver also affect the discrimination of narrowband signals, such as two ambient signals or an ambient signal and a suspected EUT emission. Previously, a percentage of the frequency span has been applied as the factor to discriminate between signals, i.e., if one signal is less than or equal to a predetermined percentage of the frequency span from another signal measured at a different time, they are considered to be the same. This technique of signal recognition produces unsatisfactory results, particularly when the frequency span is wide.

SUMMARY OF THE INVENTION

One embodiment of the present invention provides a test method and apparatus that enables automation of discriminating narrowband signals. Specifically, the invention provides a method and apparatus for comparing two frequency domain signals, which are measured at different times, to determine whether or not they are the same signal.

In accordance with the invention, to discriminate two peaks using a measuring receiver having a digital display, at least a separation of two display increments is needed. For example, the measuring receiver can be a spectrum analyzer. A display increment for a spectrum analyzer is defined as (frequency span/number of display points). Also, in accordance with the invention, resolution of two distinct signals requires that the signals be at least one measuring receiver bandwidth apart. Furthermore, in accordance with the invention, to account for unknown signal characteristics, this criterion can be adjusted to be K times resolution bandwidth of the measuring receiver, where K is a constant less than or equal to one.

Preferably, the resulting expression for a comparison of the two signals is that the two signals must be separated by at least a frequency E defined as:

$$E = 2(\text{frequency span}/N) + K * RBW$$

wherein:
- E = possible frequency error of a signal;
- span = frequency range swept by the measuring receiver, for example, a spectrum analyzer;
- N = number of points measured;
- RBW = resolution bandwidth of the resolving bandpass filter of the measuring receiver; and
- K = constant less than or equal to one to account for unknown signal characteristics.

Errors inherent in the operation of the spectrum analyzer, such as span accuracy and frequency, are relative errors. These errors have been observed to have a minimal effect on narrowband signal recognition.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawings:

FIG. 2 shows two signals measured at different times that must be discriminated in accordance with one embodiment of the narrowband signal recognition method and apparatus of the invention;

FIG. 3 shows an example of measurement frequency bands, namely, for Santa Rosa, Calif.;

FIG. 4 shows a command file for an open-site EMI measurement;

FIG. 7 shows routines for use in characterizing EUT emissions;

FIG. 8 shows a final list of EUT emissions;

FIG. 11 shows a configuration table for the EMI measurement system shown in FIG. 9;

FIG. 18 shows selected commands to create a suspect list;

FIG. 19 shows an exemplary suspect list;

FIG. 20 shows an automatic characterization setup.

DETAILED DESCRIPTION OF THE PREFERRED EMBODIMENTS

Figure 1:
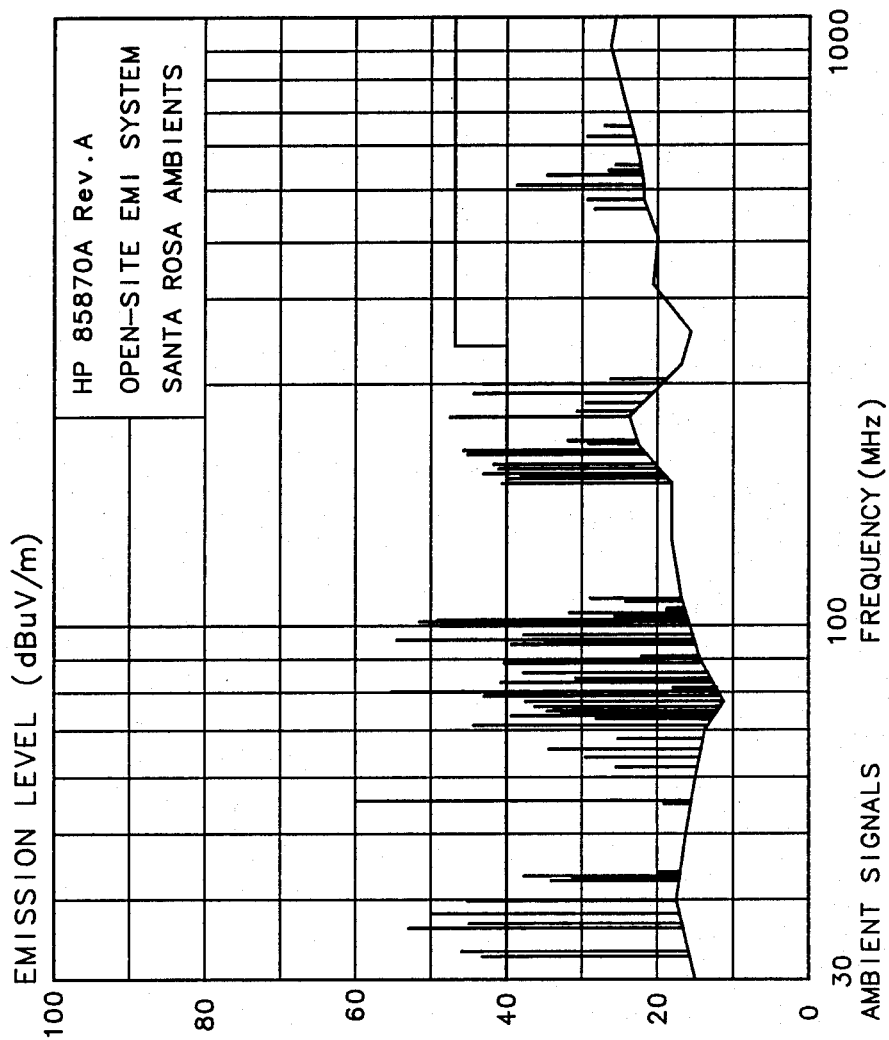
FIG. 1 illustrates typical electromagnetic signal ambients at an exemplary site, e.g., Santa Rosa, Calif.

The present invention provides a test method and apparatus to aid a site operator in discriminating between signals measured at different times, as well as enabling a level of automation which is appropriate using state-of-the-art instrumentation for performing EMI measurements, such as open-site EMI measurements. For example, the method in accordance with the invention is preferably implemented in the system program of an HP 85870A Open-Site EMI Measurement System available from Hewlett-Packard Company, Signal Analysis Division, Rohnert Park, Calif. Specific examples of operation which are presented below refer to this system.

The invention determines whether or not two measured signals are to be considered the same. These signals are measured at different times during an EMI measurement.

Four known effects can influence the position of a signal in the frequency domain. One factor is basic instrument error which allows an error in the start frequency of a sweep, nonlinear effects of the sweep ramp, etc. These errors are typically small and are not further considered.

There are three additional factors. These are the digital uncertainty, which is expressed as the frequency span divided by the number of measurements performed in the sweep, the width of the resolving bandpass filter, and any uncertainty in the signal under consideration.

The digital uncertainty becomes the dominant uncertainty in wide spans (frequency spans >> measuring bandwidth). For example, if 1000 measurements are performed in a 100 MHz span, then the digital uncertainty is 100 kHz. Using a finite width measuring receiver bandpass filter, it is apparent that an actual frequency of a signal could lie in either of the adjacent digital display buckets. It follows that the frequency uncertainty due to the digital resolution must be less than 2 digital display buckets. In the example, the digital uncertainty is 2 (100e6 Hz/1000) which equals 200 kHz.

Figure 2:
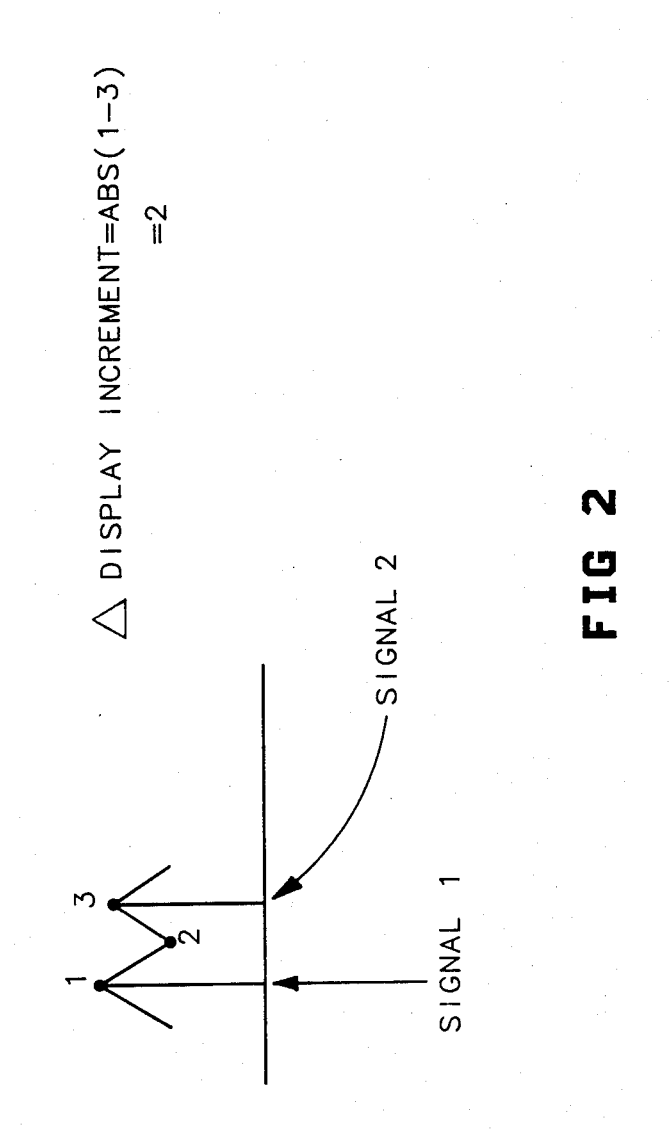

Accordingly, using a digital display, the detection of two distinct peaks requires a separation of at least two display increments, as shown in FIG. 2, i.e., $E_2 = 2$ (frequency span/number of discrete points measured in the span). This is a first order approximation if the signal is not a pure CW signal, and the signal characteristics are not known a priori, or the signal characteristics have not been measured or estimated.

As the span becomes smaller, the effects of the measuring receiver bandpass filter become dominant. Fundamental to the resolution of two signals using a measuring receiver is the resolution bandwidth of the receiver. Generally, two signals which vary in frequency by less than the width of the resolving bandpass filter cannot be discriminated. Stated differently, the ability to resolve two distinct signals typically requires a separation of at least one resolution bandwidth.

However, if the two signals are measured at different times, the frequency of the peak of one signal can be found at a frequency different from the frequency of the peak of the second. This can indicate the presence of two signals and yet be within one bandwidth. A factor ($K \leq 1$) can be used to increase the probability of identifying two signals which are separated by less than one bandwidth so as to account for any uncertainty in the signal under consideration. This applies only to signals measured at different times.

In accordance with the invention, the resulting expression for a comparison of the two signals is preferably that the two signals must be separated by at least a frequency E defined as:

$$E = 2(\text{frequency span}/N) + K * RBW$$

where:
E = possible frequency error of a signal;
span = frequency range swept by the measuring receiver, for example, a spectrum analyzer;
N = number of points measured;
RBW = resolution bandwidth of the resolving bandpass filter of the measuring receiver; and
K = constant less than or equal to one to account for unknown signal characteristics.

For example, the number of points N measured is 1000 for HP 8566 and HP 8568 Spectrum Analyzers available from Hewlett-Packard Company, Signal Analysis Division, Rohnert Park, Calif. With the specific application of this concept to open-site EMI measurements, preferably signals are allowed to be falsely detected as separate signals in order to take into account unknown signal characteristics, i.e., 1 RBW→K * RBW = $E_1$.

In an exemplary implementation of the invention, the following FNM_compare$ routine is substituted for the one in REV A.0000 of the HP 85870A Open-Site EMI Measurement System program to assist the operator in performing open-site measurements by enabling narrowband signal recognition by discriminating signals measured at different times.

```
100   DEF FNM_compare$(Active_bw, INTEGER Pointer
101   M_compare:REM
102 !
103 ! THIS FUNCTION COMPARES THE FREQUENCY IN Temp_freq
      WITH THE FREQUENCY IN
104 ! Freq(Pointer). IF THEY FALL WITHIN AN ACCEPTABLE
      UNCERTAINTY CRITERIA,
105 ! THE TWO FREQUENCIES ARE CONSIDERED TO BE THE SAME
      SIGNAL. THE STRING
106 ! VARIABLE IS THEN SET TO "TRUE". OTHERWISE, THE
      FUNCTION RETURNS A
107 ! "FALSE" TO THE CALLING ROUTINE.
108 !
109 ! PASSED PARAMETERS:    PASSED IN: Pointer = AN
                            INTEGER FROM 1 TO 500.
110 !                       RETURNED: Match$ = A STRING,
                            "TRUE" OR "FALSE".
111 !
112 ! GLOBAL VARIABLES REQUIRED:
113   COM/Band_1/ INTEGER Current_band,Num_bands
114   COM/Band_2/ REAL Bounds(1:30,1:2)
115   COM/Data_2/ REAL Temp_ampl,Temp_freq,
      Temp_uncer,INTEGER Temp_dp
116   COM/Data_3/ REAL Freq(*),Uncert (*),Freq_dp$
117 !
118 ! LOCAL VARIABLES REQUIRED:
119   DIM Match$[5]
120 !
121   Match$="FALSE"
122   Dig_unc=(Bounds(Current_band,2)
      -Bounds(Current_band,1))/1000
123   IF (ABS(Temp_freq-Freq(Pointer))
      <.5Active_bw+(2*Dig_unc)) THEN Match$
      = "TRUE"
124 !
      125 RETURN Match$
126 !
127 FNEND                    ! END OF FN M_compare$
```

This system enable the operator to perform measurements quickly, accurately, and repeatedly.

In operation, the spectrum analyzer is used both under computer control and manually to search the frequency spectrum for EUT emissions. The significant EUT emissions found are then preferably characterized using an antenna tower and turntable that are positioned automatically or manually. The internal data structure of the system program keeps track of all signals identified as ambients, suspected EUT emissions, or final EUT emissions. Frequency, peak and quasi-peak amplitude, antenna height, turntable azimuth, pertinent notes or comments, and the exact conditions of the spectrum analyzer, quasi-peak adapter, and preselector are kept with the data for all final signals measured. Also, the system program allows formatting of custom reports which may be required, for example, by regulatory agencies.

Considered in more detail, the system program can generate a list of ambient signals and/or suspected EUT emissions for any specified range (band) of frequencies automatically, separate EUT emissions from ambient signals, and characterize EUT emissions. The frequency ranges (bands) can be reconfigured as appropriate for the specific test environment. The system program can also correct measured data for transducer calibration factors and system gains/losses and test to limits of choice. Furthermore, the antenna can be raised and lowered, and the turntable can be rotated automatically, as well as manually. The system program records antenna and turntable positions as part of the data. The measurement data can be stored for later review. The system program displays and can print measurement data and text in a variety of forms.

A four-step process is used for open-site EMI measurements. The first step is the installation process which consists of initially defining and inputting the parameters needed to set up the EMI measurement system properly for identification and measurement of EUT emissions. Next, a list of the ambient signals is prepared for the site. This becomes the measurement setup and is stored on a configuration file.

Step two consists of developing a "suspect list" of EUT emissions. These are signals which cannot be identified as ambients. In step three, the site operator decides which signals are the important EUT emissions and assigns them to a "final list." The fourth step is to characterize the final emissions individually to determine the site conditions that produce the highest field-strength readings.

After the measurement process has been completed, reports and outputs can be generated as required to describe the EUT emissions. Also, the data can be stored in a data library.

The installation procedure is as follows. This is the first process performed after the EMI measurement system is placed on line and all equipment is operational. Defining a measurement setup consists of inputting transducer correction factors, measurement system gain/loss, limit line values, etc.

The measurement spectrum is partitioned into logical, manageable bands. These bands are used in characterizing the ambient environment and also in searching for and identifying suspect EUT emissions, as shown in FIG. 3. The partitioning of these bands depends on the local environment. One factor is signal density. A crowded portion of the spectrum might be segmented into bands that cover only a few megahertz. For example, the FM radio band is preferably partitioned into three or four bands of only a few megahertz, whereas areas of lesser activity might cover 50 to 100 MHz. The FCC frequency allocations provide a benchmark for deciding the band segmentation. For example, the low VHF television allocations (channels 2-4) can be assigned as a band. The six-meter amateur radio band may become another. The aircraft bands can be assigned another, and so forth, until the desired frequency range of measurement is covered. Once this has been done, the bands preferably are not changed, but they become part of the measurement setup used.

Next, an ambient list is generated by tuning each band and building a frequency-ordered list of the ambient signals. Besides frequency, the amplitude, frequency uncertainty, and appropriate comments can be included in the list as well. This list becomes a historical record, but it can be updated to reflect the variability of the ambient environment. Narrowband signal recognition in accordance with the invention discriminates ambient signals measured at different times.

Identifying suspect signals is as follows. This consists of automatically or manually locating suspect signals in each band and assigning them to a suspect list. This suspect list contains signals that cannot be absolutely identified as ambients. Here the objective is to produce a frequency list of suspected EUT emissions without missing any.

A process known as digital video averaging provides a level of noise reduction that can also be used effectively to identify signals. This consists of sweeping the band a number of times and keeping a running average of the amplitude of each point measured in the span during each sweep. Noise pulses that appear in one trace are averaged out by this process, and the resultant trace contains only the narrowband peaks.

The frequency location of the resultant peaks is compared to the active ambient list for matches. Narrowband signal recognition in accordance with the invention discriminates measured signals from ambient signals measured earlier. Frequencies which do not match within the frequency uncertainty of the measurements are added to the suspect list.

The process of sweeping bands using the noise reduction technique and then locating suspect narrowband EUT emissions is a basis for automating the identification process. Proper use of this automated process results in a high probability of identifying suspect EUT emissions. However, there is still a need to provide interactive control of the site conditions, EUT state, band selection, etc. As shown in FIG. 4, using a "command file" to drive the automated process can enable the operator to maintain control over the process.

Figure 5A:
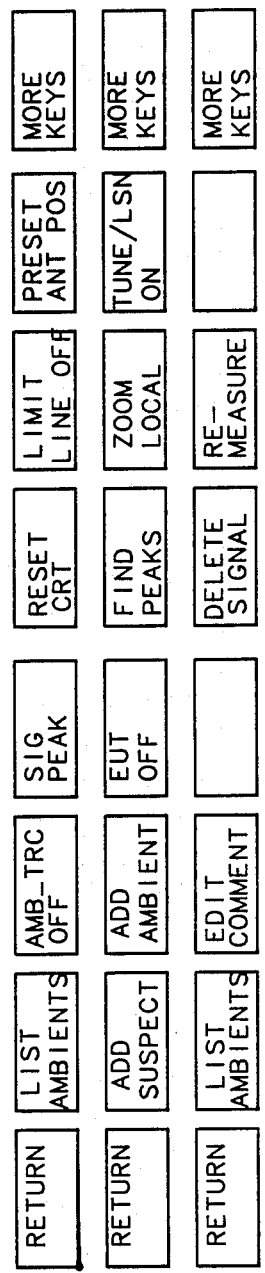
FIG. 5 shows correspondence between a suspected EUT emission and the frequency of a marker on the measuring receiver CRT.
Figure 5B:
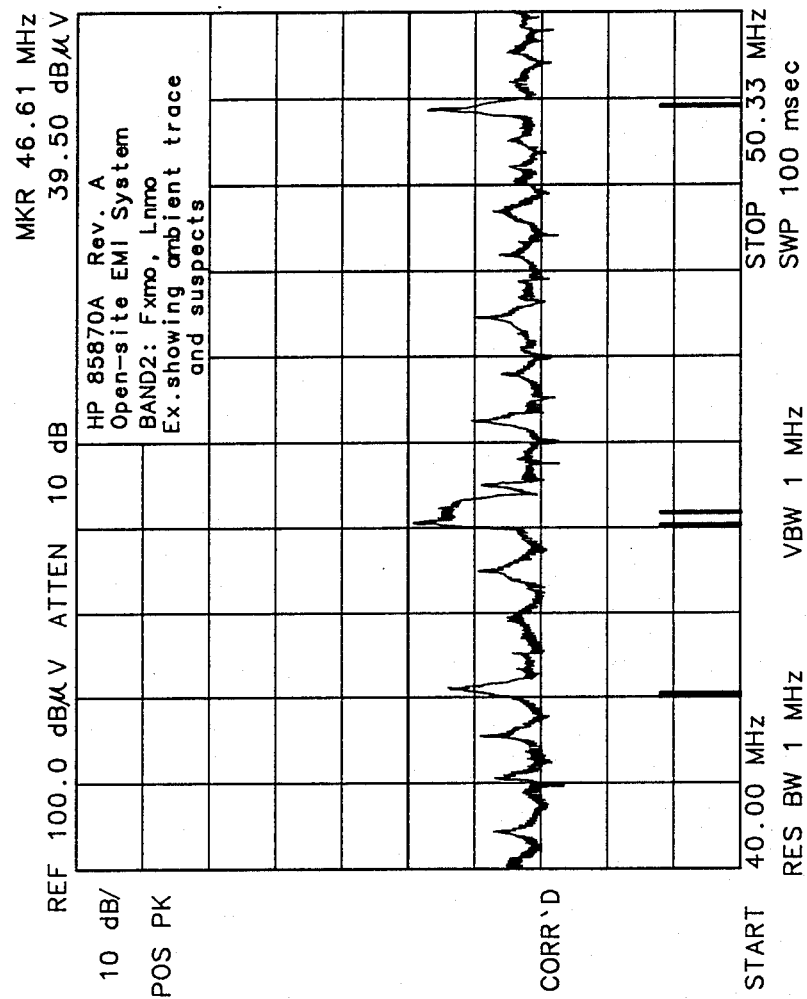

Next, the results must be verified manually, which involves interaction between the measuring equipment and the band suspect list. The current band suspect list is shown on the computer CRT, and the selected band is tuned and actively swept by the measuring receiver. A location trace is generated showing the location of the ambients for that band. One-to-one correspondence is maintained between a selected suspect on the list and the frequency of the marker on the measuring receiver CRT, as shown in FIG. 5.

Computer measurement routines, accessed by menu keys, allow the operator to zoom into the selected signal in a reduced span for a closer inspection, activate a "tune and listen" function that allows the marker frequency to be detected and listened to, find the peaks in the present span using video averaging, show the active limit line in the present span, and add signals to the lists. In addition to the computer routines, the operator has available manual control of the measuring receiver.

Figure 6:
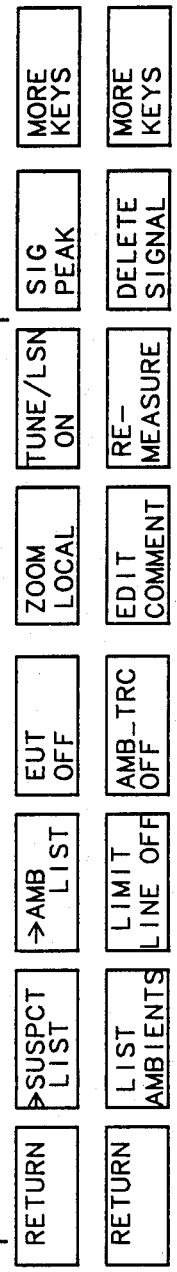
FIG. 6 shows a list of suspected EUT emissions.

The third step of the measurement process involves selecting the final EUT emissions and assumes that all possible suspect signals have been identified. At this point, the list of suspects is reduced by the operator to only the significant emissions emanating from the EUT. Computer routines and control functions are provided to aid in the decision-making process. A composite list of the suspect signals found in the bands is then compiled, as shown in FIG. 6. The appropriate band is automatically tuned, and the marker of the measuring receiver is positioned on the frequency of the selected suspect. Each suspect judged to be significant is assigned to a final list, which will be characterized.

The final step in the measurement process involves characterizing the final EUT emissions and consists of finding the conditions that maximize the radiations emanating from the EUT. After these maximum conditions are found, the signal is measured using peak or quasi-peak detection. The results are recorded along with the deviation from the limit, the site conditions, and the correction factor used to convert to field strength and account for EMI measurement system gain or loss. All the settings of the EMI measurement system are recorded to provide traceability for re-measurement or verification.

Routines that set up the site conditions can be entered in the system program. The computer can control the turntable and the antenna height and polarity and the reading of these settings. The turntable, for example, can be rotated while reading the peak amplitude of a signal, and the turntable can be returned to the azimuth that produced the maximum amplitude reading. The same operation can be provided for the antenna height and polarity. In addition, automated antenna towers and turntables provide a means to adjust the site conditions from the menu keys of the computer for manual control. The system program can also read the current settings whenever this information is needed. This facilitates the characterizing process.

FIG. 7 shows the selections available to build these characterization routines. An example of an operator-defined command file is shown at the right of FIG. 7. This can significantly reduce the time required to find the maximums of final signals.

A list of the final signals appears on the computer CRT, as shown in FIG. 8. The signal selected with the scrolling arrow on the computer keyboard is tuned on the measuring receiver in a narrow span. The site conditions are then adjusted to find the maximum(s). When the maximum conditions are found, the signal is re-measured. This process is repeated until all emissions on the final list are characterized.

Reports consisting of text, operator entry fields, and final measurement data in tabular and graphic form are provided for presenting the measurement results. A library is also provided to store and retrieve the reports.

Support for various system peripherals is also provided. Printers, plotters, and mass storage devices needed to output the results and to store data in the various libraries used by the system program can be controlled.

The operation of an exemplary implementation of the EMI measurement system in accordance with the invention will now be described in detail. The system is preferably the HP 85870A Open-Site EMI Measurement System altered to perform narrowband signal recognition to discriminate signals as described earlier. This system facilitates field-strength measurements at an open site.

Figure 9:
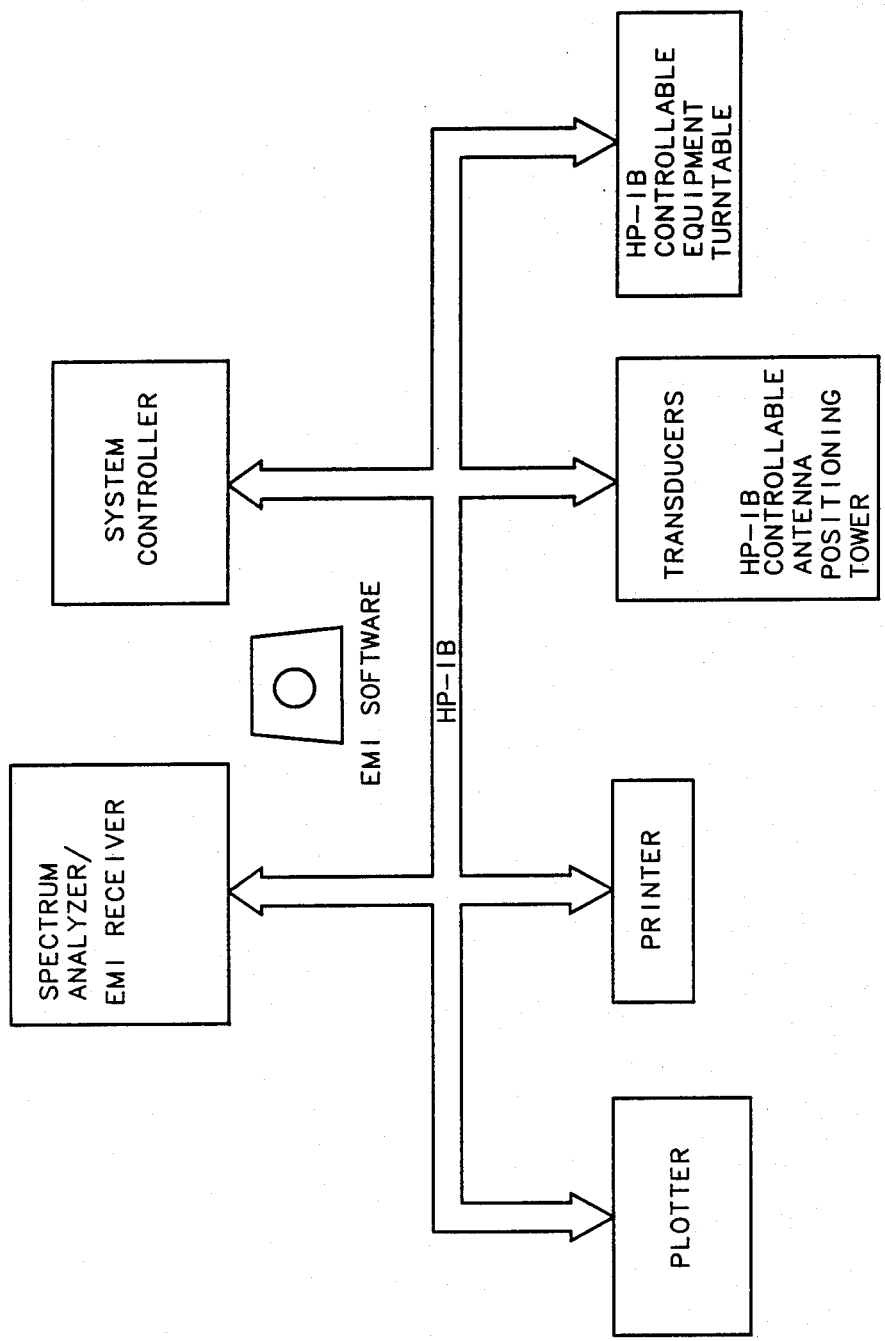
FIG. 9 shows an implementation of the EMI measurement system in accordance with one embodiment of the invention.

The system program runs on HP Series 200 or 300 Desktop Computers and uses the HP 8566B, HP 8567A, or HP 8568B Spectrum Analyzer. The following outlines both the specific equipment required and the optional equipment supported. FIG. 9 shows a typical EMI measurement system configuration in accordance with the invention.

The following measurement equipment is needed for operation of the system program. A spectrum analyzer is needed. The spectrum analyzer can be an HP 8566B 100 Hz-22 gigahertz (GHz) (with firmware date code of 5.5.85 or later), HP 8567A 10 kilohertz (kHz)-1550 MHz (with firmware date code of 4.6.85 or later), or HP 8568B 100 Hz-1500 MHz (with firmware date code of 14.1.85 or later).

Accessories, such as antennas, current probes, and filters are also needed for performing commercial measurements. The following preamplifiers can be used: HP 8447A-H64, 0.01-50 MHz; HP 8447D, 0.1-1300 MHz; and HP 8349A-H01, 1-10 GHz.

Also, the following measurement equipment can be used for operation of the system program. An HP 85650A Quasi-Peak Adapter is needed for CISPR-based testing and for the tune and listen procedure. An HP 85685A RF Preselector is needed for CISPR-based VDE testing and overload protection. An HP 85685A Option K42, K43 Antenna Positioning Tower is needed for adjusting the height of the antenna. An HP 85685A Option K40, K41 Equipment Testing Turntable is needed for rotating the antenna.

The following computer equipment is required for operation of the system program. The computer can be an HP 9816S Option 001 Option 805 Technical Computer, HP 9836S Option 001 Model 236 Technical Computer, HP 9836CS Option 001 Model 236 Technical Computer, HP 98580A Series 300 Model 310 Technical Computer, or HP 98581A Series 300 Model 310 Technical Computer, each with an HP 98257A One Mbyte Memory Board; or an HP 98582A Series 300 Model 320 Technical Computer or HP 98583A Series 300 Model 320 Technical Computer, each with a medium resolution monitor only. Mass storage devices include an HP 9122S/D 3.5" Flexible Disc Drive, HP 9133H 20 Mbyte Winchester Disc Drive with 3.5" Flexible Disc Drive, HP 9134H 20 Mbyte Winchester Disc Drive, HP 9153A 10 Mbyte Winchester Disc Drive with 3.5" Flexible Disc Drive, HP 9154A 10 Mbyte Winchester Disc Drive, or HP Shared Resource Management (SRM) connection.

The following computer/peripheral equipment can be used for operation of the system program. Plotters are HP-IB plotters and include an HP 7440A 8-Pen Graphics Plotter, HP 7470A 2-Pen Graphics Plotter, HP 7475A 6-Pen Graphics Plotter (with firmware upgrade for the HP 8566B if the firmware date code for the spectrum analyzer is 16.7.85 or earlier), or HP 7550A 8-Pen Graphics Plotter. Printers are HP-IB printers and include an HP 2225A Thinkjet Printer, HP 82906A Impact Graphics Printer, HP 2671G Thermal Graphics Printer, or HP 2673A Thermal Graphics Printer, all of which duplicate CRT graphics. An HP 98620B DMA Controller card can be incorporated to increase data transfer speed to disc. An HP 98635A Floating Point card reduces computation time. An HP 50962A Coax Interface is needed to connect to an SRM network.

Two BASIC overlays for the HP 46021A computer keyboard are provided with the system program. The HP part numbers of the overlays are: 98546-84001 and 98546-84002.

Installation of the HP 85870A Open-Site EMI Measurement System consists of three stages. The three stages are: installing the hardware; installing the system program; and running the program.

The HP 85870A Open-Site EMI Measurement System can be either a stand-alone system or a workstation within an SRM network. The following outlines the installation procedures for both. The procedures assume that the required (and optional) equipment has been prepared for use.

The first step is to install additional memory cards in the computer, if necessary. The computer must contain at least 2 Mbyte of memory. Next, if an SRM network is to be used, the SRM interface is installed in the computer, if necessary. Then HP-IB addresses are set for all equipment. Table I below lists the factory preset addresses of all system components. Addresses other than those listed can be used, but such changes must be entered in the system program.

TABLE I

| EMI COMPONENT | Address |
| --- | --- |
| Spectrum Analyzer | 18 |
| Quasi-Peak Adapter | 17 |
| Attenuator/Switch Driver | 28 |
| System Plotter | 05 |
| System Printer | 01 |
| Preselector | 18 |
| Antenna Tower | |
| Turntable | |

Figure 10:
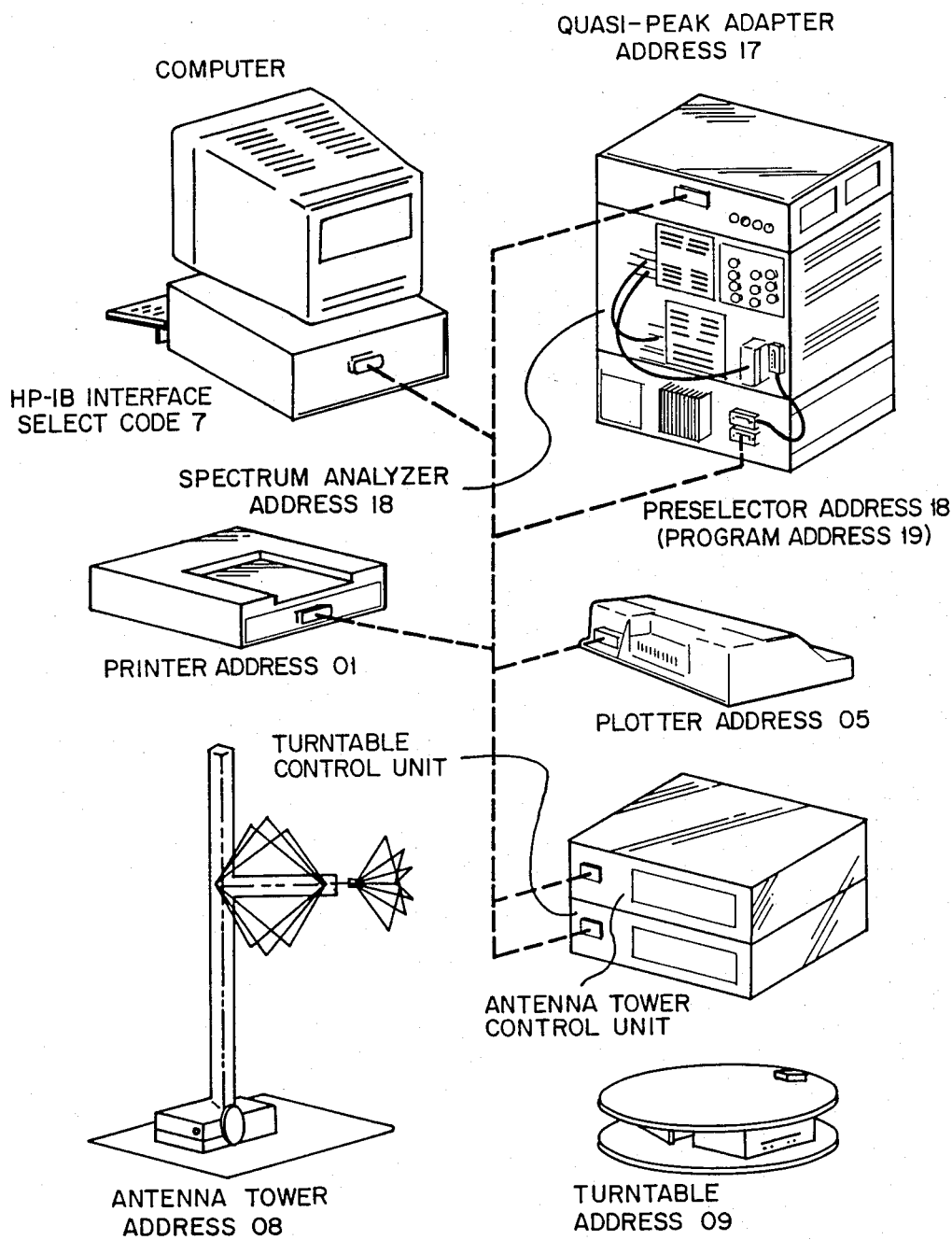
FIG. 10 illustrates the EMI measurement system shown in FIG. 9 interconnected by HP-IB.

The HP-IB address switch of the preselector is factory preset to 18. However, in the utility section of the system program, the HP-IB address of the preselector is set to 19, that is, one above whatever its HP-IB address switch is set to. LISTEN ONLY is set to 0 on all address switches. Each component is set to a different HP-IB address. If an external disc drive is used (other than SRM), its HP-IB address must be different from all other system components. Next, the equipment is interconnected on the HP-IB. FIG. 10 shows a typical system installation. If the HP 85685A RF Preselector is used, the HP-IB interconnect cables must be connected as shown in FIG. 10. Finally, power is connected to all system components.

The system program can be loaded into the computer from the computer disc drive(s) or from an external flexible disc drive. The same procedure is used for both.

The system program runs on any of the following HP 9000 computers: Series 200 (Model 216); Series 200 (Model 236); Series 300 (Model 310); or Series 300 (Model 320). There are three types of keyboards supported on 9000 computers. These keyboards are: HP 46021A, HP 98203B, and HP 98203A keyboards. The following differences between the three types of keyboards are pertinent. "SELECT" (HP 46021A), "EXECUTE" (HP 98203B), and "EXEC" (HP 98203A) perform the same function. "RETURN" (HP 46021A), "ENTER" (HP 98203B), and unshifted "ENTER" (HP 98203A) perform the same function. Type "CONT" then press "RETURN" (HP 46021A), "CONTINUE" (HP 98203B), and "CONT" (HP 98203A) perform the same function.

The process of installing an operating system from a disc into memory of a computer is typically referred to as "booting." Booting is a straightforward operation if only one operating system is accessible to the computer at any given time. There may, however, be more than one system that is accessible. For example, there may be a system residing on a hard disc drive connected to the computer. In that case, a different procedure is required to boot from flexible discs. Both procedures are available.

The term "msus" is an abbreviation for mass storage unit specifier. Every disc drive connected to the computer has its own specific location or msus (e.g., HP 8280X, 702, 0).

The term "MSI" is an abbreviation for MASS STORAGE IS. It is used to designate a disc drive as the system default mass storage device. Once this is done, all system mass storage operations automatically refer to the default drive, and the msus need not be entered each time.

The following procedure is performed if only one operating system is accessible to the computer at any given time. In the case of the HP 98603A BASIC 4.0 ROM system, the procedure begins at the third step.

First, the main power to the computer is turned off. The main power to all other equipment remains on.

Second, the system program (OEMS) Disc 1 is inserted into a disc drive that is connected to the computer. The disc drive that is used to boot from automatically becomes the default system mass storage device. The MSI statement is only needed to change the current system default mass storage device.

Third, the main power to the computer is restored. The computer runs its self-test and then searches all devices for an operating system to boot. Since only one operating system is accessible to the computer, this system is booted. The name of the operating system being booted and the location where it was found (msus) are displayed in the upper-right portion of the computer CRT. When the system program Disc 1 is loaded, the following message appears on the computer screen:

---
NOTICE
Please place OEMS Disc 2 in drive.
Then press CONTINUE.
---

Fourth, if there are other flexible disc drives in or connected to the computer and it is desired to know the msus of each drive, the three above steps are repeated for each drive.

Fifth, the operator follows the instructions displayed on the computer screen to complete the installation process. When the installation process is completed, a configuration table is displayed on the computer CRT, as shown in FIG. 11.

When multiple operating systems are present, the computer uses a searching sequence when looking for operating systems and boots the first system it finds. The following procedure describes how to select an operating system to be booted. This procedure can only be performed with boot ROM revision 3.0 or later. The first two steps are the same as in the case of a single operating system described above.

Third, the main power to the computer is restored. While the computer is running its self-test, the space bar is pressed several times. This signals the computer that the operator wants to override its default selection.

Fourth, the computer finds all operating systems and displays their locations and system file names in the upper right portion of the computer CRT. To the left of each operating system file name is a code number (e.g., 1B). The operating systems can be distinguished by their associated locations (msuses) and by their system file names.

Fifth, the operator keys the code number (e.g., IB) that corresponds to the operating system to be booted. When the system program Disc 1 is loaded, the following message appears on the computer screen:

---
NOTICE
Please place OEMS Disc 2 in drive.
Then press CONTINUE.
---

Sixth, if there are other flexible disc drives in or connected to the computer and it is desired to know the msus of each drive, steps one through five are repeated for each drive.

Seventh, the operator follows the instructions displayed on the computer screen to complete the installation process. When the installation process is completed, the configuration table is displayed on the computer screen, as shown in FIG. 11.

The files required for using an SRM network or for converting keycodes to characters for local language keyboards are not loaded automatically. To have these files loaded automatically each time that the computer is booted, the AUTOST program is modified by the following procedure. It is assumed that system program Disc 1 is loaded into the memory of the computer. The AUTOST file resides on this disc.

Initially, the operator types EDIT and then presses "RETURN". The AUTOST file is displayed on the computer CRT. Next, the operator scrolls down to line number 42, using the scroll keys or knob of the computer. Then, the operator presses the "INSERT LINE" key on the computer keyboard. In the case of an SRM network, the operator types LOAD BIN "SRM"&Disc2_loc$ and then presses "RETURN" or the equivalent key. Next, he or she types LOAD BIN "DCOMM"&Disc2_loc$ and then presses "RETURN" or the equivalent key.

If the operator wishes to convert keycodes to characters for local language keyboards, he or she types LOAD BIN "LEX"&Disc2_loc$ and then presses "RETURN" or the equivalent key. The operator next removes the system program Disc 1 and inserts Disc 2 into the disc drive, types RUN, and then presses "RETURN". The system program Disc 2 is then removed, and once again Disc 1 is inserted into the disc drive. The operator types PURGE "AUTOST" and then presses "RETURN" or the equivalent key. Next, the operator types STORE "AUTOST" and then presses "RETURN" or the equivalent key. Finally, the operator follows the instructions displayed on the computer screen to complete the installation process. When the installation process is completed, the configuration table is displayed on the computer screen, as shown in FIG. 11.

The operator can prepare new discs, both flexible and hard, for use by a procedure called "initialization." It is assumed that the system program is currently loaded. Before a disc can be initialized, the system program is paused. To pause the program, the top level soft keys are first displayed on the computer CRT. When they are, the operator presses the unshifted "STOP" key on the computer keyboard. Next, the operator follows the procedure for initializing discs located in the documentation provided with the disc drive. He or she then types CONT and then presses "RETURN".

The following procedure describes how to store the system program on an SRM network to avoid having to manually load all five discs each time that the operator wants to use the EMI measurement system. The operator first stores a file called "SYSTEM_OEMS" in a volume called "SYSTEMS".

Next, he or she stores a file called "OEMS" and its associated default data files in the same volume. The operator also lists the directory of the "SYSTEMS" volume to ensure that previously mentioned files have been stored. It is assumed that the system program is currently loaded and that the top level soft keys are currently displayed on the computer CRT.

Thereafter, the operator presses the unshifted "STOP" key on the computer keyboard to pause the program. Next, he or she types STORE SYSTEM "/SYSTEMS/SYSTEM_OEMS:REMOTE 21" and then presses "RETURN" or the equivalent key. The volume containing "SYSTEM" files may require the use of a password.

An asterisk appears in the lower right corner of the computer screen indicating that the file is being stored. When the asterisk disappears, the operator types CAT "/SYSTEMS"REMOTE 21" and then presses "RETURN" or the equivalent key to ensure that the "SYSTEM_OEMS" file is on the list currently displayed on the computer screen.

Next, the operator types STORE "/SYSTEMS/OEMS: REMOTE 21", and then presses "RETURN" or the equivalent key. Thereafter, he or she types CAT "/SYSTEMS"REMOTE 21" and then presses "RETURN" to ensure that the "OEMS" file is on the list displayed on the computer screen.

To save the default configuration files on the SRM network, the operator inserts system program Disc 6 into the appropriate disc drive. Next, he or she types COPY "OEMS_AMB1" TO "/SYSTEMS/OEMS_AMB1:REMOTE 21" and then presses "RETURN". Thereafter, the operator types COPY "OEMS_AUTOC" TO "/SYSTEMS/OEMS_AUTOC:REMOTE 21" and then presses "RETURN". Next, he or she types COPY "OEMS_AUTOI" TO "/SYSTEMS/OEMS_AUTOI:REMOTE 21" and then presses "RETURN". Subsequently, the operator types COPY "OEMS_CFG66" TO "/SYSTEMS/OEMS_CFG66:REMOTE 21" and then presses "RETURN". Next, he or she types COPY "OEMS_CFG68" TO "/SYSTEMS/OEMS_CFG68:REMOTE 21" and then presses "RETURN". Afterwards, the operator types COPY "OEMS_HPIB" TO "/SYSTEMS/OEMS_HPIB:REMOTE 21" and then presses "RETURN". Finally, he or she types COPY "OEMS_RPT" TO "/SYSTEMS/OEMS_RPT:REMOTE 21" and then presses "RETURN".

The following procedure describes how to store the system program on a local hard disc to avoid having to manually load all five discs each time the operator wants to use the EMI measurement system. The operator first stores a file called "SYSTEM_OEMS" in a volume of the hard disc. Then he or she stores a file called "OEMS" and its associated data files in the same volume. The operator also lists the volume directory to ensure that the previously mentioned files have been stored. It is assumed that the system program is currently loaded and that the top level soft keys are currently displayed on the computer CRT.

Thereafter, the operator presses the unshifted "STOP" key on the computer keyboard to pause the program. Next, he or she types STORE SYSTEM "SYSTEM_OEMS: msus" and then presses "RETURN" or the equivalent key. The term msus refers to the location of the volume on hard disc where the operator wishes to store the "SYSTEM_OEMS" file.

An asterisk appears in the lower right corner of the computer screen indicating that the file is being stored. When the asterisk disappears, the operator types CAT ": msus" and then presses "RETURN" or the equivalent key to ensure that the "SYSTEM_OEMS" file is on the list currently displayed on the computer screen.

Next, the operator types STORE "OEMS: msus" and then presses "RETURN" or the equivalent key. This file is stored in the same volume as the "SYSTEM_OEMS" file.

An asterisk appears in the lower right corner of the computer screen indicating that the file is being stored. When the asterisk disappears, the operator types CAT ":msus" and then presses "RETURN" to ensure that the "OEMS" file is on the list displayed on the computer screen.

To save the default configuration files on the hard disc, the operator inserts system program Disc 6 into the appropriate disc drive. Next, he or she types COPY "OEMS_AMB1" TO "/SYSTEM/OEMS_AMB1: msus" and then presses "RETURN". Thereafter, the operator types COPY "OEMS_AUTOC" TO "/SYSTEM/OEMS_AUTOC: msus" and then presses "RETURN". Next, he or she types COPY "OEMS_AUTOI" TO "/SYSTEM/OEMS_AUTOI: msus" and then presses "RETURN". Subsequently, the operator types COPY "OEMS_CFG66" TO "/SYSTEM/OEMS_CFG66: msus" and then presses "RETURN". Next, he or she types COPY "OEMS_CFG68" TO "/SYSTEM/OEMS_CFG68: msus" and then presses "RETURN". Afterwards, the operator types COPY "OEMS_HPIB" TO "/SYSTEM/OEMS_HPIB: msus" and then presses "RETURN". Finally, he or she types COPY "OEMS_RPT" TO "/SYSTEM/OEMS_RPT: msus" and then presses "RETURN".

The procedure for booting from an SRM network or a local hard disc is identical. First, the operator connects power to all equipment. While the computer is running its self-test, he or she presses the space bar several times (i.e., if there is more than one system accessible to the computer). Next, the operator types the code number that appears to the left of the "SYSTEM_OEMS" file on the computer CRT.

After "SYSTEM_OEMS" has been loaded, the operator types LOAD "OEMS" and then presses "RETURN" or the equivalent key. An asterisk appears in the lower right corner of the computer screen indicating that the "OEMS" file is being loaded. When the asterisk disappears, the operator types RUN then presses "RETURN".

When booting is completed, the following message appears on the computer screen.

| NOTICE |
|---|
| Trouble trying to access |
| OEMS Disc 5. Correct the MSI |
| below and press ENTER or press |
| ABORT to discontinue program. |

The location (msus) booted from is the current system MSI. The computer needs to access system program Disc 5. Therefore, the operator needs to change the MSI from the hard disc or SRM network to the disc drive where Disc 5 will be inserted.

The operator inserts system program Disc 5 into a disc drive that is connected to the computer. Next, he or she types the msus of the disc drive containing system program Disc 5 and then presses "ENTER". When the program has been successfully loaded, the following display appears on the computer screen.

| EMI COMPONENTS CURRENTLY CONNECTED TO SYSTEM: |
|---|
| 701 Printer |
| 717 Quasi-Peak Adapter |
| 718 Spectrum Analyzer |
| 719 Preselector |

| EMI COMPONENTS CURRENTLY NOT CONNECTED TO SYSTEM: |
|---|
| 705 Plotter |
| 708 Tower |
| 707 Table |
| 728 Preselector |

| LIBRARY MSI: |
|---|

The operator verifies that all system instruments connected are displayed in the CURRENTLY CONNECTED list. If an instrument is connected but the power is not on, or if its HP-IB address does not match one of the addresses shown, it will be displayed in the CURRENTLY NOT CONNECTED list. If the operator wishes to change any of the HP-IB addresses, he or she presses "RECONFIG".

Note that LIBRARY MSI is blank. The operator designates a disc drive to be used for library operations if the library disc is in a location other than the current system default mass storage device. To accomplish this, he or she first presses "RECONFIG". Next, the operator presses "MOREKEYS". Then he or she presses "LIB MSI". Next, the operator types the msus of the disc drive to be used for library operations and then presses "ENTER". If the operator wishes to save the configuration, he or she ensures that system program Disc 5 is still in the disc drive before pressing "YES". If no changes in the configuration are necessary, the operator presses "CONTINUE". The system is now ready for use.

The following is an overview of the major function blocks of the system program and provides an example measurement with the EMI measurement system.

Figure 12:
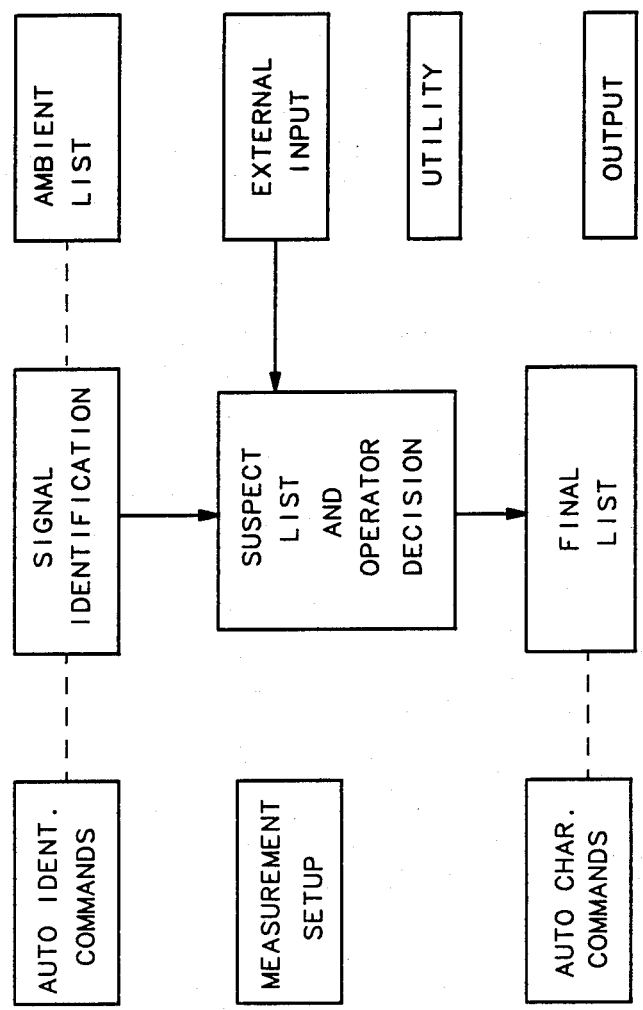
FIG. 12 is a schematic drawing of the top level of the system program for the EMI measurement system shown in FIG. 9.

The system program is separated into ten different sections, as shown in FIG. 12. Each section is intended for a specific use. Each program section is briefly described below.

The measurement setup section of the system program defines the different parameters for each measurement. The measurement setup section is used to configure up to 30 frequency ranges (bands) to meet specific needs of the measurement site; set the spectrum analyzer, preselector, and quasi-peak adapter to the desired settings for each band and store these parameters in the setup library; enter characteristics of the transducers, limits, and any EMI measurement system gains/losses to be used for each measurement and store them in the transducer, limit, and system gain/loss libraries, respectively; edit spectrum analyzer display title lines; change the peak routine criteria; and set physical limits for antenna tower and turntable.

The ambient list section of the system program loads, stores, and displays ambient signal lists. The ambient list section is used to load ambient signal lists from the ambient library; store ambient signal lists in the ambient library; list an ambient signal list on the computer screen and display it on the spectrum analyzer; and add, delete, or re-measure signals on an ambient list.

The signal identification section of the system program initiates routines which automatically or manually result in a list of suspect signals (signals that cannot be absolutely identified as ambients). The signal identification section is used to initiate an automatic measurement routine to identify suspects in the frequency bands; develop and maintain the ambient signal list; and generate a suspect list using the following computer controlled procedures. The procedures include sweeping each frequency range (band) on the spectrum analyzer while displaying a marker trace to help identify the location of ambient signals; displaying a signal list for each band on the computer screen: adding pertinent comments for any signal on the suspect list; and providing access to the spectrum analyzer controls and computer aided diagnostic routines to develop the suspect list.

In the "auto ident. commands" section of the system program, automatic signal identification command files that search for suspect signals can be set up. FIG. 4 shows such a command file. Available control functions and procedures are provided in a list. The operator selects from that list to build the command file. These files become part of the system configuration and can be activated by the operator. When the EMI measurement system is activated, it steps through the command file, executing the commands one-by-one. A list of available commands is shown on the left in FIG. 4. The selected commands are shown on the right. Operator-written subroutines can be added.

After generating a list of suspect signals, the suspect list and operator decision section is used to determine which of the suspect signals are significant EUT emissions and assign them to the final list. Routines are included to help identify which signals are significant EUT emissions.

The final list section of the system program characterizes the significant EUT emissions identified in the suspect list section. The final list section is used to initiate an automatic measurement routine which is used to help characterize the final signals; determine maximum amplitude of an EUT emission using computer controlled procedures; and perform quasi-peak and/or peak amplitude measurements on selected signals. The data structure is updated with all current conditions, including all measurement settings. The final list section is also used to display the current measurement conditions on the computer screen; show the selected final signal on the spectrum analyzer display in real time using the measurement settings established for the selected signal; position the spectrum analyzer marker on the signal indicated by the arrow (→) on the final list; and raise and lower the antenna, change polarization, and operate the turntable by using computer control keys. The current conditions are displayed on the computer screen.

The "auto char. commands" section can be set up to provide an automatic characterization routine to help establish the maximum signal conditions.

The output section outputs test results in the desired format. The output section is used to print out lists and plot graphs using resident forms; design custom forms and store them in the report library; and show the various signal lists on a logarithmic frequency versus field strength graph.

Finally, the utility section provides access to system routines. The utility section is used to calibrate the system; set the system time and date; change the HP-IB address of system components; change the library mass storage device; add a facility name at the top of the spectrum analyzer screen; and configure system program default files. The external input section allows computer keyboard access to the measurement lists of the system program. For example, known clock frequencies or other frequencies of concern can be entered directly into the suspect list.

The system program is a soft key driven program. All actions are initiated by pressing soft keys. These soft key labels appear at the bottom of the computer screen. The computer keyboard contains special function keys "f1" through "f8" which are used to initiate the soft key actions. The computer keyboard is also used for editing notes and tables and entering data.

The top level of the system program appears on the computer screen, as shown in FIG. 12. The scroll keys ( ↑ , ↓ , ←, →) or knob of the computer can be used to select the desired program section. Each program section has its own set of soft keys.

Each system program section has more than one level. Most system program sections have three levels. After accessing a system program section, the operator presses the "RETURN" key repeatedly until the top level appears on the computer screen. For example, to access the third level of the ambient list section, the operator presses "PLOT AMBIENTS" at the first level and "PLOTTER DUMP" at the second level. To return to the top level, he or she presses "RETURN", "RETURN".

A system program default is provided which includes all setup parameters necessary to perform a measurement. The four major steps that follow demonstrate how to perform a measurement using the system program.

The first step is to create a suspect list. The second step is to decide whether or not the signals on the suspect list are produced by the EUT. Pertinent EUT emissions are assigned to the final list. The third step is to characterize each signal on the final list and store measurement data in the data library. Lastly, the fourth step is to generate the final report.

The first step of signal identification involves manually or automatically searching through each selected frequency range (band), with the EUT switched on, for signals that cannot be absolutely identified as ambient signals. These signals are called "suspects." The manual method of searching each band results in the highest probability of identifying suspect signals. Zoom local, tune and listen, find peaks, EUT on/off, rotate turntable, and signal peaking are some of the procedures designed to help identify signals.

The signal identification section can be used to manually create a list of suspect signals, as illustrated by the following procedure. The signal identification section is selected from the top level. The operator presses "PREVIEW". This procedure is useful for viewing the entire measurement range of a transducer at a glance. This allows the operator to check the EMI measurement system for possible measurement problems related to equipment setup. In addition, this procedure allows the operator to become familiar with the EUT and thereby plan measurement strategy.

Figure 13:
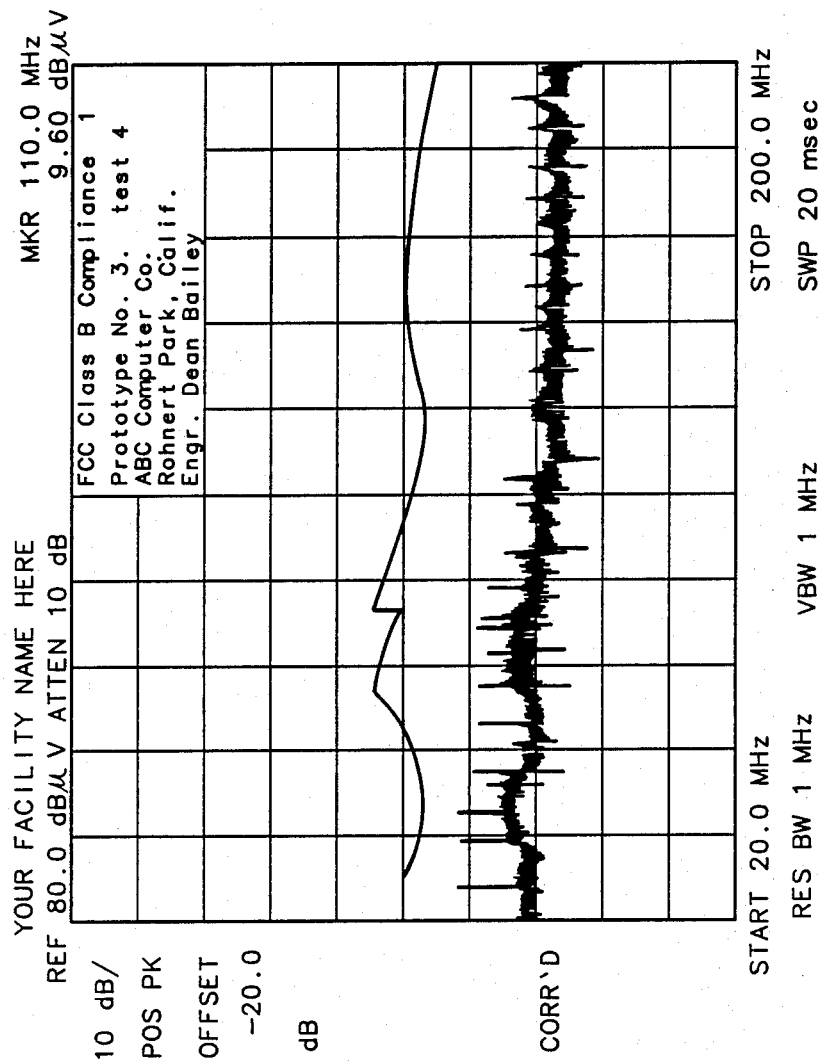
FIG. 13 is a spectrum analyzer display of measurements by the EMI measurement system shown in FIG. 9 in a preview mode.

Next, the operator selects the appropriate transducer. The measurement range of the selected transducer is displayed on the spectrum analyzer display. FIG. 13 is an example of a measurement range displayed in the preview mode.

Then the operator presses "MANUAL MSMT" at the first level. The spectrum analyzer tunes to the currently active band.

Next, the operator enters a new band number to measure using the numeric keys of the computer and then presses "RETURN" to accept the entry. Note that the "+" and "−" keys can also be used to select the next higher or lower band to measure. The spectrum analyzer now tunes to the new band.

The operator ensures that the EUT is on. The operator turns it on by pressing the "EUT ON" soft key, if necessary.

At this point, the operator may want to vary the site conditions of the selected band using the signal peaking technique. He or she presses "SIG PEAK". It is assumed that an HP-IB controlled antenna tower and turntable are being used. The operator next presses "TABLE CW" and/or "TABLE CCW" to rotate the turntable. He or she also presses "ANTENNA UP" and/or "ANTENNA DOWN" to raise and lower the antenna within preset height limits. The operator can also press "POLARIZATION" to change the antenna polarization. The current state of the tower and turntable are updated on the computer screen.

Figure 14:
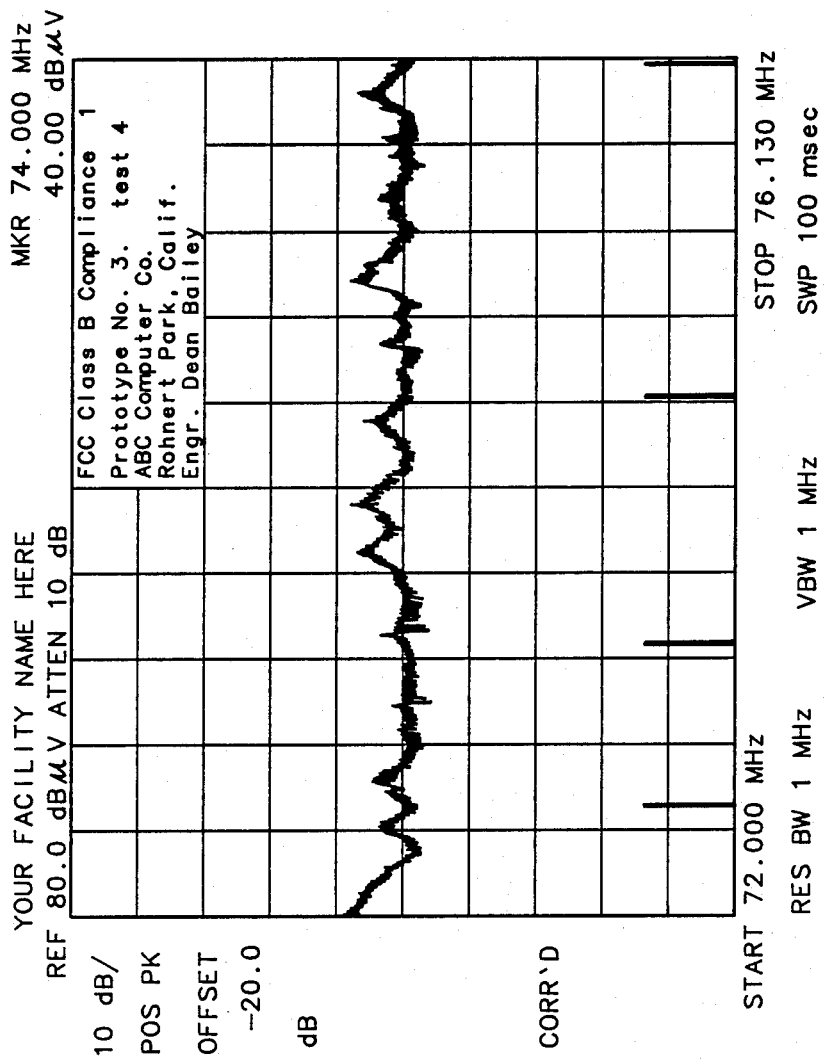
FIG. 14 is a spectrum analyzer display of measurements by the EMI measurement system shown in FIG. 9 forming an ambient signal trace.

When the peaking process is completed, the operator presses "RETURN". An ambient trace appears at the bottom of the spectrum analyzer display. (This assumes that an ambient list is present in the EMI measurement system.) The ambient trace is used to mark the location of each ambient signal found in the selected band, as shown in FIG. 14.

Knowing where the ambient signals are located aids in searching for suspect signals. Closer investigation of the suspect signals enables the operator to decide if these signals are ambients or if they are emissions from the EUT.

The "FIND PEAKS" routine finds all peaks in the resultant trace and generates a peak trace and displays it on the spectrum analyzer marking the location of each peak. This routine performs video averaging on the trace over ten sweeps with reduced video bandwidth. The parameters of this function can be changed by the operator.

If "FIND PEAKS" is pressed when the analyzer is in the MAX HOLD mode, video averaging is not performed. All peaks in the MAX HOLD trace are found, and a peak trace is generated and displayed on the spectrum analyzer marking the location of each peak. This serves to improve the probability of intercepting intermittent and broadband signals.

Figure 15:
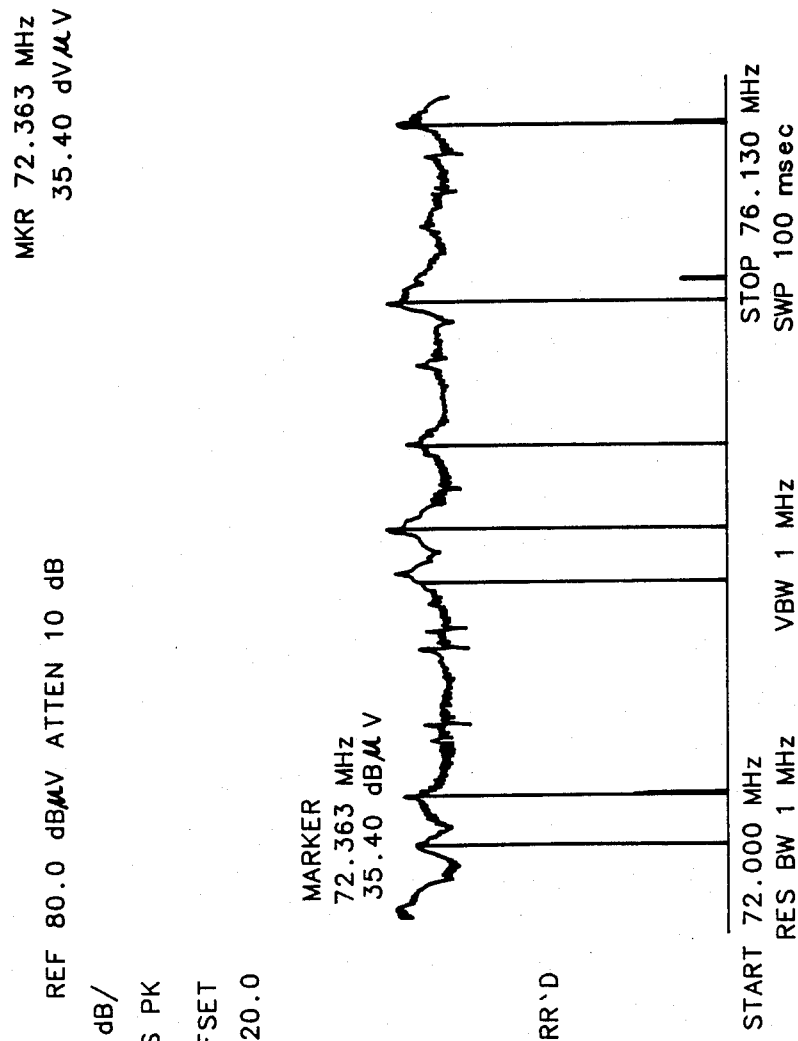
FIG. 15 is a spectrum analyzer display of results of a peak process procedure performed on the ambient signal trace shown in FIG. 14.

The operator presses "FIND PEAKS" at the second level. Depending on the existing conditions mentioned, the peaks are found, and a special trace shows the peak locations. FIG. 15 is the result of the peak process performed on the trace shown in FIG. 14. Accordingly, it is easier to see where the suspect signals are with respect to ambient signals.

The operator presses the "→" key on the computer keyboard to cause the marker on the spectrum analyzer display to move to the next higher frequency peak shown on the special trace. He or she presses the "←" key on the computer keyboard to cause the marker on the spectrum analyzer display to move to the next lower frequency peak shown on the special trace.

Many methods of distinguishing suspect signals from ambient signals exist. These methods include zoom local and tune and listen, turn the EUT on and off, rotate the turntable, and local spectrum analyzer control.

In the zoom local and tune and listen procedure, the operator first zooms in on a signal. Then he or she listens to the signal using the audio capability of the HP 85650A Quasi-Peak Adapter.

If the operator has performed the "FIND PEAKS" function on the trace, he or she uses the "→" key or "←" key on the computer keyboard to tune the marker to the desired signal. Otherwise, the operator uses the "up" and "down" step keys on the spectrum analyzer to tune the marker to the signal of interest. He or she next presses "ZOOM LOCAL" to zoom in on the marked signal. Each time this key is pressed, a 10:1 span reduction occurs. Then the operator presses "TUNE/LSN ON" and adjusts the audio volume control on the quasi-peak adapter.

The operator can tune the marker to either side of the peak using the data knob on the spectrum analyzer and listen to determine whether or not the signal is an ambient or suspect. Some signals can be easily identified as ambients, such as AM, FM, and TV stations. It is possible for an operator to identify a suspect signal just by listening to it. If listening to the signal gives no indication, other techniques for identification described below can be employed.

If the signal is ambient, the operator can assign it to the current ambient list by pressing "ADD AMBIENT". This calls the narrowband signal recognition routine in accordance with the invention. If the signal does not match a signal on the ambient list, the ambient list and ambient trace are updated to include the new ambient signal. The current marker amplitude is used to calculate field strength.

If the signal cannot be absolutely identified as an ambient signal, the operator assigns it to the suspect list by pressing "ADD SUSPECT". This calls the narrowband signal recognition routine in accordance with the invention. If the signal does not match a signal on the suspect list, the marker frequency and the calculated field strength value are added to the suspect list.

The operator presses "RETURN" (or "CONTINUE" if using a series 200 computer) on the computer keyboard to reset the spectrum analyzer to the current band as defined in the table of HP 85870A measurement bands.

Turning the EUT on and off is another technique for determining the source of a signal. Depending on the EUT, however, this procedure may not always be practical.

The system program provides control for turning the EUT on or off by using Auxiliary Switch A on the quasi-peak adapter as a control signal to switch a power relay system. Position 1 corresponds to the "ON" state, and position 2 corresponds to the "OFF" state. The quasi-peak adapter uses the auxiliary switches via a 36-pin connector on the rear panel of the instrument.

If the operator has performed the "FIND PEAKS" function on the trace, he or she can use the "→" key or "←" key on the computer keyboard to tune the marker to the desired signal. Otherwise, the data knob on the spectrum analyzer can be used to position the marker to the signal of interest. The operator presses "EUT OFF"

and "EUT ON" if an automatic EUT switch is being used. Otherwise, he or she manually turns the EUT off and on. If the signal disappears when the EUT is switched off, the operator can assign it to the suspect list by pressing "ADD SUSPECT". If the signal does not disappear when the EUT is switched off, it can be assigned to the ambient list by pressing "ADD AMBIENT".

In cases where switching the EUT on and off is not practical, rotating the turntable can serve as an alternate procedure. If the operator has performed the "FIND PEAKS" function on the trace, he or she can use the "→" key or "←" key on the computer keyboard to tune the marker to the desired signal. Otherwise, the "up" and "down" step keys on the spectrum analyzer can be used to position the marker to the signal of interest. The operator may wish to press the MAX HOLD key corresponding to Trace A on the spectrum analyzer. He or she then rotates the turntable while monitoring the spectrum analyzer display. If the signal changes in amplitude, the operator can assign it to the suspect list by pressing "ADD SUSPECT".

In the following procedures, the operator uses the spectrum analyzer's front panel controls to help analyze signals. Suspect signals can sometimes be "masked" by ambient signals and go undetected.

Figure 16:
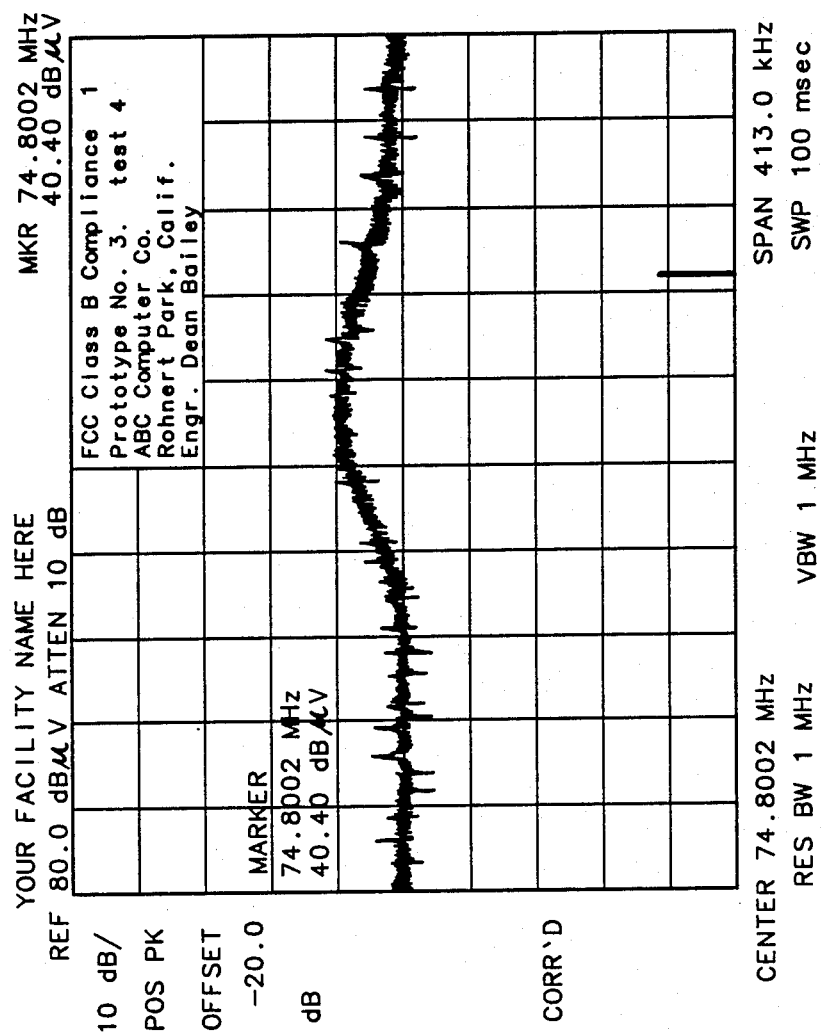
FIG. 16 is a spectrum analyzer display of two unresolved measured signals.

FIG. 16 is an example of two signals spaced close together in frequency so that they appear as one signal. By reducing resolution bandwidth of the spectrum analyzer, as described in the following procedure, the two signals in FIG. 16 can be resolved.

Figure 17:
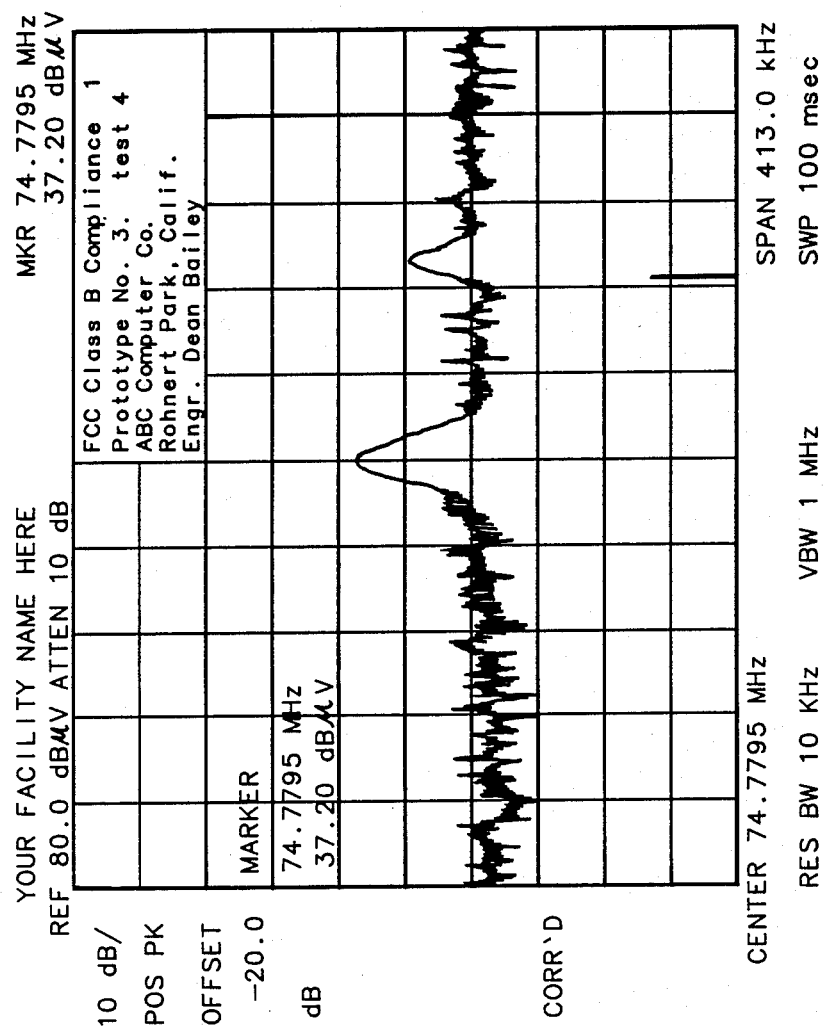
FIG. 17 is a spectrum analyzer display of the measured signals shown in FIG. 16 after reducing resolution bandwidth.

If the operator has performed the "FIND PEAKS" function on the trace, he or she uses the "→" key or "←" key on the computer keyboard to tune the marker to the desired signal. Otherwise, the operator uses the data knob on the spectrum analyzer to position the marker to the signal of interest. The operator presses "ZOOM LOCAL" to zoom in on the signal designated by the marker of the spectrum analyzer. Next, he or she presses the RES BW key on the spectrum analyzer. Then the operator presses the "down" step key on the spectrum analyzer (or rotates the data knob clockwise) to increase the resolution bandwidth. FIG. 17 reveals that there are in fact two signals present.

If the desired resolution bandwidth results in an undesirably slow sweep speed, the frequency span can be decreased allowing the desired resolution at a faster sweep speed. If the resolution bandwidth is automatically selected by the spectrum analyzer (i.e., the light above the RES BW key is off), the resolution bandwidth can decrease with a decrease in frequency span. This also serves to "unmask" closely spaced suspect and ambient signals.

Whenever frequency adjustments are made on the spectrum analyzer, the "LCL" key on the preselector must be pressed to "couple" the preselector to the analyzer. This ensures that the preselector tracks the analyzer automatically. First, the operator presses the "LCL" key on the preselector. Next, he or she presses the "FREQUENCY SPAN" key on the spectrum analyzer. Then the operator presses the "down" step key on the spectrum analyzer (or rotates the data knob counterclockwise). The frequency span is decreased each time that the operator presses the "down" step key. Pressing the "up" step key (or rotating the data knob clockwise) increases the frequency span. The operator can assign the suspect signal to the suspect list using the "ADD SUSPECT" key. The operator presses "RETURN" on the computer keyboard to once again sweep the current band of frequencies.

Intermittent emissions such as those with very low PRF's, or transmitters that are "keyed" only occasionally, can also be missed. By increasing the sweep time of the spectrum analyzer, and by using the "max hold" function, the operator increases the probability of intercept. The operator presses the SWEEP TIME key on the spectrum analyzer. Next, he or she presses the "up" step key on the spectrum analyzer (or rotates the data knob clockwise) to increase sweep time. Then the operator presses the MAX HOLD key corresponding to Trace A.

The "max hold" function displays the largest amplitude occurring at each of the 1001 horizontal points across the spectrum analyzer CRT over successive sweeps. If an intermittent signal is encountered using this procedure, the shape, frequency, and amplitude of the signal remain displayed. The operator tunes the spectrum analyzer marker to the suspect signal. Then he or she presses "ADD SUSPECT" to assign the signal to the suspect list.

Reducing the video bandwidth of the spectrum analyzer smoothes the trace, which sometimes exposes signals that otherwise would be undetected. For example, narrowband signals in the presence of impulsive or noisy signals can be better resolved with a reduced video filter. First, the operator presses the VIDEO BW key on the spectrum analyzer. Next, he or she presses the "down" step key on the spectrum analyzer (or rotates the data knob counterclockwise) to reduce video bandwidth while monitoring the spectrum analyzer display. The amplitude of the signals will begin to be attenuated as the video bandwidth is reduced. The intent is to find all suspect signals. Therefore, the operator need not be concerned with making accurate amplitude measurements at this time. The first system control key from the left (Recall) on the computer keyboard can be used to recall the previous twenty instrument states.

The auto ident. commands section can be used to set up an automatic measurement and automatically create a list of suspect signals. A command file is set up to search the selected bands for ambients, with the EUT off. Narrowband signal recognition in accordance with the invention enables discrimination of signals. Any new ambients are added to the ambient list. This is done to update the ambient list in case new ambients are now present.

The EUT will then be switched on, and the same selected bands will be searched. Any signals found while the EUT is on will be compared to the signals on the ambient list. Narrowband signal recognition in accordance with the invention enables discrimination of signals. Any signals found that are not on the ambient list are assigned to the suspect list. First, the operator presses "RETURN" to return the program to the first level. Next, he or she selects the auto ident. commands section from the top level. Then the operator presses "EDIT/REVIEW". Commands can be added to the selected commands column of the automatic identification commands table. The operator can set up the same commands as those shown in FIG. 18.

It is assumed that the operator is using an automatic EUT switch. He or she must still add the TURN EUT ON command to the selected commands list even if an automatic EUT switch is not being used. The TURN EUT OFF and TURN EUT ON commands signify to the system program which list to assign a signal to.

Also, the PAUSE FOR MANUAL INTERACTION command is added to enable the operator to turn the EUT on manually. The selected commands list looks like the one shown in FIG. 18. First, the operator presses "RETURN" to return to the first level. Next, he or she presses "AUTO MSMT" to initiate the measurement. When the measurement is completed, the signal identification section is selected and shown on the computer screen. The operator presses "MANUAL MSMT" to review and verify the automatically selected suspects and to ensure that no possible suspects were missed.

The second step is compilation of the suspect list. If the signal identification process has been correctly followed, the suspect list contains the significant EUT emissions. The operator decides which of these significant EUT emissions are assigned to the final list.

Suspect signals can be "masked" when they are spaced too close to ambient signals. The operator ensures that all suspect signals have been found before accessing the suspect list and operator decision section.

First, the operator selects the suspect list and operator decision section from the top level. Next, he or she presses "LIST SUSPECTS" at the first level. FIG. 19 illustrates an example of a suspect list. Then the operator aligns the arrow, that appears on the suspect list, at the desired suspect signal.

The suspect signal that the arrow points to on the computer screen is also the signal that the marker is tuned to on the spectrum analyzer display. If the arrow is aligned at another signal, using the scroll keys or knob of the computer, the marker on the spectrum analyzer display also tunes to this signal. The frequency of each suspect signal determines which band is tuned to on the spectrum analyzer display.

Each signal on the suspect list is preferably observed individually. The purpose of this is to both determine if a suspect is an EUT emission and which EUT emissions are significant enough to assign to the final list.

Many of the features used in the signal identification section are also useful to make these decisions. A typical test can include many suspect signals covering the frequency spectrum. Regulatory agencies and testing operations have varying requirements on what is to be reported. Since the final characterization of signals can be tedious and time-consuming, eliminating unnecessary or insignificant signals at this time increases productivity. Functions previously described (e.g., EUT ON/OFF, zoom local and tune and listen, signal peaking, and local spectrum analyzer control) are available in this section.

The third step is compilation of the final list. The operator characterizes each signal on the final list. This process can be done automatically or manually.

The antenna and turntable can be adjusted to find the peak emission conditions for each signal. Final readings of field strength in peak or quasi-peak mode can be performed. Comments on each signal or on the test can be added.

The final list section can be used to manually peak each signal and perform peak and quasi-peak measurements. This manually characterizes each signal.

To manually characterize a signal, the operator first presses "RETURN" to return the program to the top level. Next, he or she selects the final list section from the top level. Then the operator presses "LIST FINAL". Thereafter, the operator aligns the arrow, that appears on the final list, next to the desired signal. Next, he or she presses "MORE KEYS". Subsequently, the operator presses "RESET POS" to reset the antenna and turntable to the original settings shown in the final list for this particular signal. Next, he or she presses "MORE KEYS". Then the operator presses "SIG PEAK".

It is assumed that the operator is using an HP-IB controlled antenna tower and turntable. Therefore, the operator presses "TABLE CW" and/or "TABLE CCW" to rotate the turntable about the original position until the maximum level is found. Next, he or she presses "ANTENNA UP" and/or "ANTENNA DOWN" to raise and lower the antenna about the original height setting until the maximum level is found. Then the operator presses "POLARIZATION" to determine the antenna polarization that yields the maximum level.

When the peaking process is completed, the operator presses "RETURN". Now that the operator has found the maximum level of this EUT emission, he or she can perform peak and quasi-peak measurements. In this regard, the operator first presses "REMEASURE" to initiate the peak measurement. The final list is updated to show the current antenna and turntable settings and corresponding peak amplitude.

Second, the operator presses "QUASI-PEAK" to perform a quasi-peak measurement. He or she tunes slightly above and below the frequency using the data knob of the spectrum analyzer to ensure that the maximum level is currently displayed on the spectrum analyzer. If the operator wishes to tune back to the original frequency, he or she presses "RETURN".

When the measurement is completed, the operator presses "ACCEPT" to assign the quasi-peak measurement to the final list. The LIM and ABS values are added to the QP section of the final list.

An asterisk appears in the T (traceability) column after a peak or quasi-peak measurement is made on a final signal. This indicates that the spectrum analyzer, preselector, and quasi-peak adapter settings that were used to characterize the signal have been saved as part of the data in the final list. This ensures that the measurement conditions that produced final data can be recreated. This manual characterization procedure can be repeated for each signal on the final list.

The auto char. commands section can be used to automatically peak each signal and perform peak and quasi-peak measurements to automatically characterize each signal. A command file much like the selected commands list in the auto ident. commands section is used to perform the automatic characterization as described in the following procedure.

First, the operator presses "EDIT REVIEW" to access the table used to set up the automatic characterization process. FIG. 20 is an example of an automatic characterization setup. The procedure for creating the command list shown in FIG. 20 is identical to that of the automatic measurement command table in the auto ident. commands section.

The following describes the entries in the selected commands list shown in FIG. 20. First, the ALL SIGNALS command automatically characterizes all signals in the final list (one at a time).

The ANT/TABLE REFERENCE: FINAL LIST POS command indicates that the antenna and turntable will be set to the positions shown in the final list for each signal. This procedure significantly reduces test time by only searching about this reference and not the entire range of the antenna and turntable for each signal.

The MOVE ANT/TABLE TO REFERENCE POSITION command sets the antenna and turntable to the reference specified using the ANT/TABLE REFERENCE POSITION command. In this case, the reference is the settings shown in the final list.

The SEARCH TURNTABLE+/−XX deg. command adjusts the turntable+/−XX degrees about the reference while searching for the maximum EUT emission (relative search) where XX is selectable from 0 to 360. The SEARCH ANTENNA+/−YY cm. command adjusts the antenna+/−YY centimeters about the reference while searching for the maximum EUT emission (relative search) where YY is selectable. The SEARCH ANTENNA and SEARCH TURNTABLE commands measure and retain the maximum amplitude of the EUT emission and automatically position the antenna and turntable where the maximum EUT emission was found.

The MEASURE ZZ sec/UPDATE DATA command records the current antenna height, turntable angle, polarization, frequency, and peak amplitude, ZZ being selectable. The amplitude is monitored for ZZ seconds, then a measurement is taken, and the final list is updated.

The operator presses "AUTO CHAR." to initiate the automatic characterization process. The graphs used to plot the relative amplitude versus antenna height or relative amplitude versus turntable azimuth of the selected final signal appear on the computer screen. These graphs are a visual representation of amplitude variations corresponding to antenna, turntable, and polarization variations. The operator uses the DUMP DISPLAY TO PRINTER command to dump these graphs to an HP-IB controlled graphics printer.

At this point, the operator may wish to store the final list data in the data library. First, he or she presses "RETURN" to access the "DATA LIBRARY" key.

It is assumed that the operator has created a library on a blank initialized disc. Next, he or she inserts the data library disc into the disc drive used for library operations. Then the operator presses "DATA LIBRARY". Next, he or she presses "STORE".

If the data library has more than one header, the operator positions the arrow under the desired header. Next, he or she presses "SELECT"Z. Then the operator enters the desired file name from the computer keyboard (up to 32 characters), presses "ADD HDR" to add a new header and the new file name or presses "INSERT" to insert a new header where the arrow is positioned and add the new file name.

The fourth step is output. The output section can be used to produce hard copies of the ambient, suspect, and final lists, plot spectrum analyzer CRT displays, and generate final text edited reports.

The list to be printed does not have to be displayed on the computer screen to be printed. First, the operator selects the output section from the top level. Next, he or she presses "PRINT LISTS". Then the operator presses "PRINT AMBIENTS" to print the ambient list, "PRINT SUSPECTS" to print the suspect list, and/or "PRINT FINALS" to print the final list. Finally, he or she presses "RETURN" to return the system program to the first level.

The output section can be used to plot a particular spectrum analyzer CRT display. This function dumps the current spectrum analyzer display to an HP-IB controlled plotter.

First, the operator presses "PLOT SA_CRT". The four-plot format appears on the computer screen. Next, he or she presses "FORMAT". This key allows the operator to select one, two, or four frames per page. Then he or she selects a format. If the two- or four-plot format is selected, the operator uses the "FRAME" soft key to select the desired frame. Finally, he or she presses "PLOT".

A logarithmic frequency plot of the signals on the ambient, suspect, or final list can be first shown on the computer screen and then dumped to either an HP-IB controlled graphics printer or plotter. First, the operator selects the output section from the top level. Next, he or she presses "PLOT LISTS" at the first level. Then the operator selects the desired signals by pressing "AMBIENT", "SUSPECT", or "FINAL".

The logarithmic display showing the selected signal information appears on the computer screen. The logarithmic display is automatically scaled to a frequency span wide enough to display all selected signals.

The frequency span can be changed as described by the following procedure. First, the operator presses "FREQ. SPAN". Next, he or she types the start frequency and then presses "ENTER". Next, the operator types the stop frequency and then presses "ENTER". Finally, he or she presses "RETURN".

The logarithmic display is re-drawn on the computer screen showing the new frequency span specifications. To dump the logarithmic display to an HP-IB controlled plotter, the operator first presses "PLOTTER DUMP". The plot format appears on the computer screen. Next, he or she presses "FORMAT" to select either one, two, or four frames per page. Then the operator presses "FRAME" when using the two- or four-frame plot format to select the location of the plot. Next, he or she presses "PLOT" to initiate the plot routine. Finally, to dump the logarithmic display to an HP-IB controlled graphics printer, the operator presses "PRINTER DUMP".

The report generator located in the output section is used to generate the final report. The default form is used in this example to enter data.

First, the operator selects the output section from the top level. Next, he or she presses "REPORTS" at the first level.

The active window outlines the first data field. The operator types the appropriate data and then presses "ENTER". Next, he or she presses the "↓" or "TAB" key to position the active window at the next data entry field. In the same way, the operator can enter all data specific to the EUT.

To insert the final list in the form immediately above the cursor position, the following procedure is performed. First, the operator presses "UPDATE FORM" at the second level. The cursor is positioned by the operator where he or she wishes the final list to be inserted, and then he or she presses "INSERT FINALS".

To insert the logarithmic display showing frequency and amplitude of all final signals immediately above the cursor position, the following procedure is performed. Initially, the operator presses "UPDATE FORM" at the second level. The cursor is positioned by the operator where he or she wishes the graphics to be inserted, and then he or she presses "INSERT GRAPHICS".

To insert a form feed immediately above the cursor position, the following procedure is used. First, the operator presses "UPDATE FORM" at the second level. The cursor is positioned by the operator where he or she wishes to insert a form feed, and then he or she presses "INSERT FORM_FD".

Finally, the operator may wish to print the report form currently shown on the computer screen on an HP-IB graphics printer. To do so, he or she presses "PRINT" at the second level.

There are many second order observations which can be developed to further determine the matching of two given signals, but the first order test described is fundamental to the matching of two signals. The foregoing description is offered primarily for purposes of illustration. While a variety of embodiments has been disclosed, it will be readily apparent to those skilled in the art that numerous other modifications and variations not mentioned above can still be made without departing from the spirit and scope of the invention as claimed below.

What is claimed is:

1. A method for discriminating two frequency domain signals, which are measured at different times, to determine whether or not they are the same signal, comprising the steps of:

measuring the frequency of a first signal by means of a measuring receiver at a first time, the measuring receiver having a selectable frequency span and a digital display for displaying a predetermined number of measured points;

measuring the frequency of a second signal by means of the measuring receiver at a second time, the second time being later than the first time;

comparing the frequencies of the first and second signals; and determining that the first signal is distinct from the second signal if the frequencies of the first and second signals differ by at least a frequency E defined as:

$$E = 2(\text{frequency span}/N)$$

where:
E = possible frequency error of a signal;
frequency span = frequency range swept by the measuring receiver; and
N = number of points measured;
thereby recognizing narrowband signals.

2. The method of claim 1 wherein the measuring receiver is a spectrum analyzer.

3. The method of claim 1 wherein the steps of measuring the frequency of the first signal and the frequency of the second signal comprise the steps of measuring the frequency of the first signal at its peak and measuring the frequency of the second signal at its peak, respectively.

4. The method of claim 1 wherein the measuring receiver comprises a resolving bandpass filter having a predetermined resolution bandwidth and the frequency E is defined as:

$$E = 2(\text{frequency span}/N) + RBW$$

where:
E = possible frequency error of a signal;
frequency span = frequency range swept by the measuring receiver;
N = number of points measured; and
RBW = resolution bandwidth of the resolving bandpass filter of the measuring receiver.

5. The method of claim 4 wherein the frequency E is defined as:

$$E = 2(\text{frequency span}/N) + K * RBW$$

where:
E = possible frequency error of a signal;
frequency span = frequency range swept by the measuring receiver;
N = number of points measured;
RBW = resolution bandwidth of the resolving bandpass filter of the measuring receiver; and
K = a constant less than or equal to one;
thereby accounting for unknown signal characteristics.

6. Apparatus for discriminating two frequency domain signals, which are measured at different times, to determine whether or not they are the same signal, comprising:

a measuring receiver for measuring the frequency of a first signal at a first time and a second signal at a second time, the second time being later than the first time, the measuring receiver having a selectable frequency span and a digital display for displaying a predetermined number of measured points;

means for comparing the frequencies of the first and second signals; and means for determining that the first signal is distinct from the second signal if the frequencies of the first and second signals differ by at least a frequency E defined as:

$$E = 2(\text{frequency span}/N)$$

where:
E = possible frequency error of a signal;
frequency span = frequency range swept by the measuring receiver; and
N = number of points measured;
whereby narrowband signals are recognized.

7. The apparatus of claim 6 wherein the measuring receiver is a spectrum analyzer.

8. The apparatus of claim 6 wherein the measuring receiver comprises a resolving bandpass filter having a predetermined resolution bandwidth and the frequency E is defined as:

$$E = 2(\text{frequency span}/N) + RBW$$

where:
E = possible frequency error of a signal;
frequency span = frequency range swept by the measuring receiver;
N = number of points measured; and
RBW = resolution bandwidth of the resolving bandpass filter of the measuring receiver.

9. The apparatus of claim 8 wherein the frequency E is defined as:

$$E = 2(\text{frequency span}/N) + K * RBW$$

where:
E = possible frequency error of a signal;
frequency span = frequency range swept by the measuring receiver;
N = number of points measured;
RBW = resolution bandwidth of the resolving bandpass filter of the measuring receiver; and
K = a constant less than or equal to one;
thereby accounting for unknown signal characteristics.

* * * * *